US007288428B2

(12) United States Patent
Muramatsu

(10) Patent No.: US 7,288,428 B2
(45) Date of Patent: Oct. 30, 2007

(54) SOLID STATE IMAGE PICKUP DEVICE AND MANUFACTURING METHOD THEREOF AND SEMICONDUCTOR INTEGRATED CIRCUIT DEVICE AND MANUFACTURING METHOD THEREOF

(75) Inventor: Masafumi Muramatsu, Tokyo (JP)

(73) Assignee: Sony Corporation (JP)

( * ) Notice: Subject to any disclaimer, the term of this patent is extended or adjusted under 35 U.S.C. 154(b) by 360 days.

(21) Appl. No.: 11/078,628

(22) Filed: Mar. 14, 2005

(65) Prior Publication Data
US 2005/0227403 A1    Oct. 13, 2005

(30) Foreign Application Priority Data
Mar. 29, 2004  (JP)  ............... P2004-095873

(51) Int. Cl.
*H01L 21/00* (2006.01)
(52) U.S. Cl. .............. 438/70; 438/72; 257/E21.352
(58) Field of Classification Search .......... 438/70, 438/71, 72; 257/E21.352
See application file for complete search history.

(56) References Cited

U.S. PATENT DOCUMENTS

| 6,352,875 B1 * | 3/2002 | Hayashi et al. ............ 438/67 |
| 6,661,025 B2 * | 12/2003 | Hirabayashi ................ 257/53 |

FOREIGN PATENT DOCUMENTS

| JP | 09-260699 | 10/1997 |
| JP | 2003-031785 | 1/2003 |

\* cited by examiner

Primary Examiner—Chandra Chaudhari
(74) Attorney, Agent, or Firm—Rader Fishman & Grauer PLLC; Ronald P. Kananen

(57) ABSTRACT

A method of manufacturing a solid-state image pickup device comprises a process for forming a plurality of photoelectric conversion elements PD within a semiconductor substrate 4, a process for forming an interconnection portion, having an interconnection layer 8 in an insulating layer 7, on the surface side of the semiconductor substrate 4, a process for forming an adhesive layer, made of a material cured at a temperature lower than a deterioration starting temperature of the interconnection layer 8, on the surface of the interconnection portion and bonding a supporting substrate 30 to the surface side of the interconnection portion through the adhesive layer 9 by heat treatment at a temperature lower than the deterioration starting temperature of the interconnection layer 8 and a process for decreasing a thickness of the semiconductor substrate 4 from the back side. A solid-state image pickup device manufacturing method can bond the supporting substrate 30 to the surface side of the interconnection portion through the adhesive layer 9 without exerting a thermal influence upon the interconnection layer 8 that was previously formed on the surface side of the semiconductor substrate 4.

10 Claims, 15 Drawing Sheets

SOLID STATE IMAGE PICKUP DEVICE AND MANUFACTURING METHOD THEREOF AND SEMICONDUCTOR INTEGRATED CIRCUIT DEVICE AND MANUFACTURING METHOD THEREOF

BACKGROUND OF THE INVENTION

1. Field of the Invention

The present invention relates to a solid-state image pickup device and a manufacturing method thereof, and a semiconductor integrated circuit device and a manufacturing method thereof.

2. Description of the Related Art

A related-art, solid-state image pickup device includes a semiconductor substrate in which circuit elements, interconnection layers and the like are formed on the surface side thereof and in which photodiodes and the like are formed on the back side thereof to introduce light from the surface side of the semiconductor substrate to pick up an image.

However, in the case of such an arrangement, incident light is absorbed or reflected on the circuit elements. The interconnection layers and the like are formed on the surface side of the semiconductor substrate so that efficiency at which incident light is photoelectrically converted is low. Thus, sensitivity of the solid-state image pickup device is lowered.

Accordingly, in order to solve such a problem, a so-called back-illuminated type solid-state image pickup device has been proposed, in which circuit elements, interconnection layers and the like are formed on the surface side of the semiconductor substrate; photodiodes are formed on the back side of the semiconductor substrate and light is introduced from the back side of the semiconductor substrate to pickup an image, to increase an aperture ratio, to receive incident light and to suppress absorption of reflection of incident light (see cited patent reference 1, for example).

On the other hand, since a semiconductor integrated circuit device is progressively increased in integration degree as elements are increasingly microminiaturized in recent years, then the number of gates used in a transistor is increased considerably, and hence the layout of an interconnection layer for interconnecting the cells of a logic circuit and for interconnecting the blocks of micro-function becomes complex.

Although it is desirable that the interconnection layer should interconnect the cells or the blocks with the shortest distance or with an equal distance, depending upon the layout circumstances, it becomes difficult for the interconnection layer to interconnect the cells or the blocks with the shortest distance or the equal distance.

In order to solve the above-mentioned problem, there has been proposed a method for forming interconnection layers not only on the surface side of the semiconductor substrate but also on the back side of the semiconductor substrate (see cited patent reference 2, for example).

[Cited patent reference 1]: Official gazette of Japanese laid-open patent application No. 2003-31785

[Cited patent reference 2]: Official gazette of Japanese laid-open patent application No. 9-260699

In the above-mentioned back-illuminated type solid-state image pickup device, in order to introduce incident light from the back side of the semiconductor substrate, the back side of the semiconductor substrate should be decreased in film thickness after the circuit elements and the photodiodes and the like are formed on the front side of the semiconductor substrate.

However, when the back side of the semiconductor substrate is decreased in film thickness, it is unavoidable that flatness of the semiconductor substrate cannot be obtained due to stress inherent in the semiconductor substrate and that the semiconductor substrate becomes weak from a mechanical standpoint.

Accordingly, as a method for solving such a problem, a supporting substrate is to be bonded to the semiconductor substrate before the back side of the semiconductor substrate is decreased in film thickness.

Manufacturing processes for manufacturing the back-illuminated type solid-state image pickup device according to this method will be described with reference to FIGS. 1A to 1F.

First, as shown in FIG. 1A, there is prepared an SOI (silicon on insulator) substrate 65 in which a single crystal silicon layer (so-called SOI layer) 64 is formed on a silicon substrate 62 through a buried oxide film (so-called BOX layer) 63, for example.

Next, a photodiode PD is formed on the SOI substrate 65 at the predetermined position within the single crystal silicon layer 64.

Then, a MOS (metal-oxide semiconductor) type transistor Tr1 and a CMOS (complementary MOS) type Tr2, each of which comprises a gate electrode 66 and a pair of a source region and a drain region, are formed on the single crystal silicon layer 64 at the predetermined positions through an insulating film (not shown), thereby exhibiting the state shown in FIG. 1B.

Next, a multilayer interconnection layer 68 (681, 682, 683) is formed on the single crystal silicon layer 64 at the positions corresponding to the MOS type transistor Tr1 and the CMOS type transistor Tr2 through an insulating layer 67, thereby exhibiting the state shown in FIG. 1C.

Next, a planarized film (not shown) is formed on the insulating layer 67, and a supporting substrate 70 is attached to the insulating layer 67 by coating an adhesive layer 69 on this planarized layer, thereby exhibiting the state shown in FIG. 1D.

Next, this back-illuminated type solid-state image pickup device is reversed up and down and thereby the back side of the SOI substrate 65, that is, the silicon substrate 62 is exposed.

Then, the exposed silicon substrate 62 and the buried oxide film 63 are removed, whereby the single crystal silicon layer 64 of the SOI substrate 65 is exposed as shown in FIG. 1E.

After that, as shown in FIG. 1F, an insulating film 72, an antireflection film, a planarized film (not shown) and the like are formed on the back side of the single crystal silicon layer 64, and an on-chip microlens 74 is formed on back side of the single crystal silicon layer 64 at its portion corresponding to the photodiode PD through a color filter 73.

In this manner, there can be obtained a back-illuminated type CMOS solid-state image pickup device 60.

In the process in which the supporting substrate 70 is bonded to the insulating layer 67 by coating the adhesive layer 69 on the insulating layer 67 on the semiconductor substrate 64 as was shown in FIG. 1D, the heat treatment is carried out in order to cure the adhesive layer 69 or to increase bonding strength at which the supporting substrate 70 is bonded to the insulating layer 67.

However, when this heat treatment is carried out at a high temperature ranging from 900° F. to 1100° F. under which temperature the SOI substrate has been manufactured so far, for example, it is unavoidable that a thermal influence is exerted upon the multilayer interconnection layer 68 (681, 682, 683) previously formed on the surface side of the single crystal silicon layer 64 and which is made of a material with low heat-resistance (Al, Cu and the like).

Also, although there is known a method of using boron phosphorus silicate glass (BPSG), phosphorus silicate glass (PSG), boron silicate glass (BSG) and the like as the material of the adhesive layer 69, since this method also uses heat treatment at a temperature ranging of from 700° C. to 900° C., it is unavoidable that a thermal influence is exerted upon the interconnection layer 68 (681, 682, 683) which was previously formed on the surface side of the single crystal silicon layer 64.

Accordingly, these high temperature heat treatments cannot be applied to the case in which the back-illuminated type solid-state image pickup device is manufactured.

Further, there is known a method of using coated glass (SOG) as the material of the adhesive layer 69 because the coated glass (SOG) can realize a planarized layer.

However, in this case, in the thin film forming processes shown in FIGS. 1D and 1E, if wet etching process is carried out, then the SOG is corroded (etched) by liquid medicine and hence bonding strength is lowered.

Further, uneven coated portions are formed depending upon the kind of the material of the adhesive layer 69 so that holes, voids and the like are formed on the interface in which the insulating layer 67 and the supporting substrate 70 are bonded together.

Also, there is proposed a method of directly bonding the single crystal silicon layer 64 and the supporting substrate 70 without coating the adhesive layer 69 on the insulating layer 67. According to this known method, since the heat treatment is carried out at 1000° C. for 10 hours, it is unavoidable that a thermal influence is exerted upon the interconnection layer 68 (681, 682, 682) which was previously formed on the surface side of the semiconductor substrate.

Further, there is proposed a method of bonding the single crystal silicon layer 64 and the supporting substrate 70 by using an adhesive tape without coating the adhesive layer 69 on the insulating layer 67. In this case, if a thick adhesive tape is used, then a problem in which the adhesive tape is torn off does not arise. However, since the adhesive tape is warped considerably after the heat treatment, a problem arises, in which an exposure process cannot be made in the following manufacturing processes.

While the case in which the solid-state image pickup device is manufactured from the SOI substrate 65 composed of a plurality of layers has been described so far by way of example, a similar problem arises also in the case in which the solid-state image pickup device having the above-mentioned arrangement is manufactured from a single layer of a silicon substrate, for example.

Also, not only in the above-mentioned back-illuminated type solid-state image pickup device but also in a semiconductor integrated circuit device, it is considered that a multilayer interconnection layer may be formed on the semiconductor substrate on which the circuit elements are formed.

Then, when such semiconductor integrated circuit device is manufactured, in order to obtain desired characteristics in the circuit elements such as transistors, it is frequently observed that the semiconductor substrate with the circuit elements formed thereon should be decreased in thickness.

Accordingly, in such a case, a problem similar to that of the case in which the back-illuminated type solid-state image pickup device is manufactured arises unavoidably.

SUMMARY OF THE INVENTION

In view of the aforesaid aspect, it is an object of the present invention to provide a solid-state image pickup device manufacturing method in which a supporting substrate can be bonded to an interconnection portion through an adhesive layer without exerting thermal influence upon an interconnection layer that was previously formed on the surface side of a semiconductor substrate.

It is another object of the present invention to provide a solid-state image pickup device in which a supporting substrate can be bonded to an interconnection portion through an adhesive layer without exerting a thermal influence upon an interconnection layer that was previously formed on the surface side of a semiconductor substrate.

It is a further object of the present invention to provide a semiconductor integrated circuit device manufacturing method in which a supporting substrate can be bonded to an interconnection portion through an adhesive layer without exerting a thermal influence upon an interconnection layer that was previously formed on the surface side of a semiconductor substrate.

It is yet a further object of the present invention to provide a semiconductor integrated circuit device in which a supporting substrate can be bonded to an interconnection portion through an adhesive layer without exerting a thermal influence upon an interconnection layer that was previously formed on the surface side of a semiconductor substrate.

According to an aspect of the present invention, there is provided a method of manufacturing a solid-state image pickup device which is comprised of a process for forming a plurality of photoelectric conversion elements within a semiconductor substrate, a process for forming an interconnection portion, having an interconnection layer in an insulating layer, on the surface side of the semiconductor substrate, a process for forming an adhesive layer, made of a material cured at a temperature lower than a deterioration starting temperature of the interconnection layer, on the surface side of the interconnection portion and bonding a supporting substrate to the insulating layer through the adhesive layer by heat treatment at a temperature lower than the deterioration starting temperature of the interconnection layer and a process for decreasing a thickness of the semiconductor substrate from the back side.

According to a method of manufacturing a solid-state image pickup device of the present invention, since this solid-state image pickup device manufacturing method includes the process for forming a plurality of photoelectric conversion elements within the semiconductor substrate, the process for forming the interconnection portion, having the interconnection layer in the insulating layer, on the surface side of the semiconductor substrate and the process for forming the adhesive layer, made of the material cured at the temperature lower than the deterioration starting temperature of the interconnection layer, on the surface side of the interconnection portion and bonding the supporting substrate to the insulating layer through the adhesive layer by heat treatment at the temperature lower than the deterioration starting temperature of the interconnection layer and the process for decreasing the thickness of the semiconductor substrate from the back side, in the process for bonding the supporting substrate to the surface of the interconnection portion through the adhesive layer, the adhesive layer can be cured by the heat treatment at the temperature lower than the deterioration starting temperature of the interconnection layer that was formed previously. Thus, the supporting substrate can be bonded to the surface side of the interconnection portion through the adhesive layer without exerting a thermal influence upon the interconnection layer that was previously formed on the surface side of the semiconductor substrate.

According to another aspect of the present invention, there is provided a solid-state image pickup device which is comprised of a semiconductor substrate, a plurality of photoelectric conversion elements formed within the semiconductor substrate, an interconnection portion, having an interconnection layer in an insulating layer, formed on the surface side of the semiconductor substrate and a supporting substrate bonded to the surface side of the interconnection portion through an adhesive layer, wherein the adhesive layer is made of a material cured at a temperature lower than a deterioration starting temperature of the interconnection layer.

According to a solid-state image pickup device of the present invention, since this solid-state image pickup device is comprised of a semiconductor substrate, a plurality of photoelectric conversion elements formed within the semiconductor substrate, the interconnection portion, having the interconnection layer in the insulating layer, formed on the surface side of the semiconductor substrate and the supporting substrate bonded to the surface side of the interconnection portion through the adhesive layer, wherein the adhesive layer is made of the material cured at the temperature lower than the deterioration starting temperature of the interconnection layer, upon manufacturing, the adhesive layer can be cured by the heat treatment at the temperature lower than the deterioration starting temperature of the interconnection layer that was formed previously. Thus, in the process for bonding the supporting substrate to the interconnection portion through the adhesive layer, it is possible to protect the interconnection layer formed on the surface side of the semiconductor substrate from being affected thermally.

According to a further aspect of the present invention, there is provided a method of manufacturing a semiconductor integrated circuit device which is comprised of a process for forming a circuit element on a semiconductor substrate, a process for forming an interconnection portion, having an interconnection layer in an insulating layer, on the surface side of the semiconductor substrate and a process for forming an adhesive layer, made of a material cured at a temperature lower than a deterioration starting temperature of the interconnection layer, on the surface side of the interconnection portion and bonding a supporting substrate to the interconnection portion through the adhesive layer by heat treatment at a temperature lower than the deterioration starting temperature of the interconnection layer.

According to a method of manufacturing a semiconductor integrated circuit device of the present invention, since this semiconductor integrated circuit device manufacturing method is comprised of the process for forming the circuit element on the semiconductor substrate; the process for forming the interconnection portion, having the interconnection layer in the insulating layer, on the surface side of the semiconductor substrate; and the process for forming an adhesive layer, made of the material cured at the temperature lower than the deterioration starting temperature of the interconnection layer, on the surface side of the interconnection portion and bonding the supporting substrate to the interconnection portion through the adhesive layer by the heat treatment at the temperature lower than the deterioration starting temperature of the interconnection layer, in the process for bonding the supporting substrate to the interconnection portion through the adhesive layer, the adhesive layer can be cured by the heat treatment at the temperature lower than the deterioration starting temperature of the interconnection layer that was formed previously. Thus, it is possible to bond the supporting substrate to the interconnection portion through the adhesive layer without exerting a thermal influence upon the interconnection layer that was previously formed on the surface side of the semiconductor substrate.

In accordance with yet a further aspect of the present invention, there is provided a semiconductor integrated circuit device which is comprised of a circuit element formed within a semiconductor substrate, an interconnection portion, having an interconnection layer in an insulating layer, formed on the surface side of the semiconductor substrate and a supporting substrate bonded to the surface side of the interconnection portion through an adhesive layer, wherein the adhesive layer is made of a material cured at a temperature lower than a deterioration starting temperature of the interconnection layer.

According to the semiconductor integrated circuit device of the present invention, since this semiconductor integrated circuit device is comprised of the circuit element formed within the semiconductor substrate, the interconnection portion, having the interconnection layer in the insulating layer, formed on the surface side of the semiconductor substrate and the supporting substrate bonded to the surface side of the interconnection portion through the adhesive layer, wherein the adhesive layer is made of the material cured at the temperature lower than the deterioration starting temperature of the interconnection layer, upon manufacturing, the adhesive layer can be cured by the heat treatment at the temperature lower than the deterioration starting temperature of the interconnection layer that was formed previously. Thus, in the process for bonding the supporting substrate to the interconnection portion through the adhesive layer, it is possible to protect the interconnection layer formed on the surface side of the semiconductor substrate from being affected thermally.

According to the solid-state image pickup device manufacturing method and the semiconductor integrated circuit device manufacturing method of the present invention, the supporting substrate can be bonded to the interconnection portion without exerting a thermal influence upon the interconnection layer that was formed previously. Therefore, it is possible to manufacture the solid-state image pickup device and the semiconductor integrated circuit device with excellent characteristics.

According to the semiconductor solid-state image pickup device and the semiconductor integrated circuit device of the present invention, when the supporting substrate is bonded to the interconnection portion through the adhesive layer, it is possible to avoid a thermal influence from being exerted upon the previously-formed interconnection layer. Therefore, it is possible to realize the highly-reliable solid-state image pickup device and semiconductor integrated circuit device with high performance.

DESCRIPTION OF THE PREFERRED EMBODIMENTS

The present invention will now be described below with reference to the drawings.

First, a solid-state image pickup device according to an embodiment of the present invention, for example, a CMOS (complementary metal-oxide semiconductor) solid-state image pickup device will be described with reference to FIGS. 2 and 3.

Figure 1A:
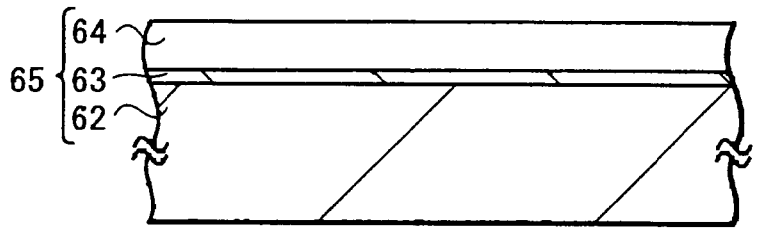
FIGS. 1A to 1F are manufacturing process diagrams showing a manufacturing method of a solid-state image pickup device according to the related art, respectively.
Figure 1B:
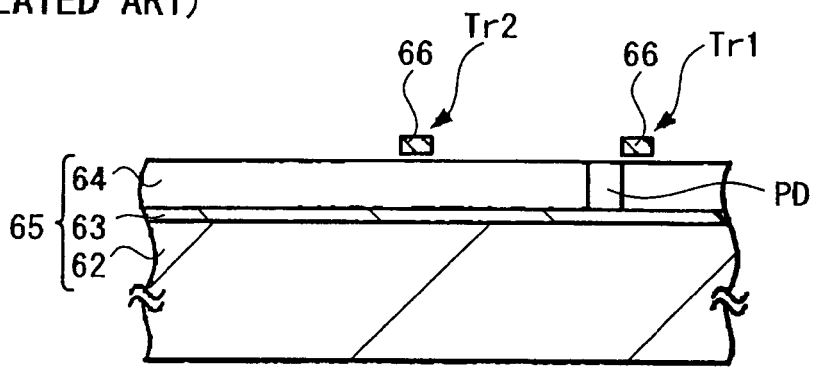
Figure 1C:
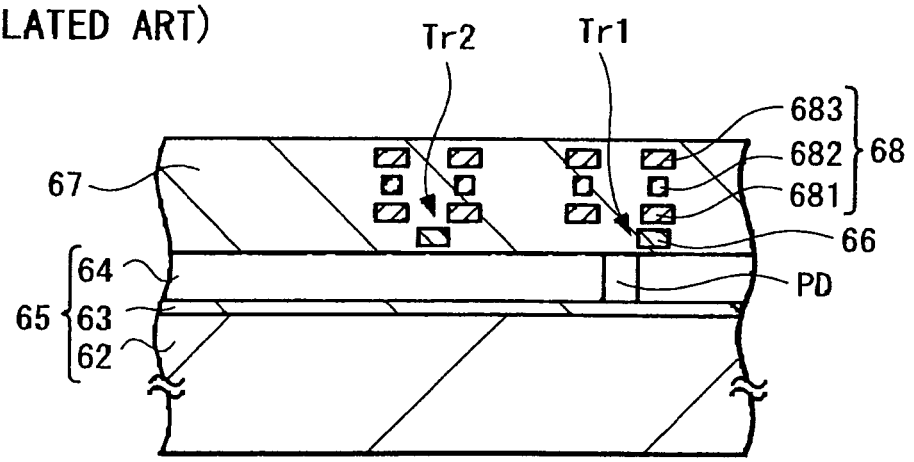
Figure 1D:
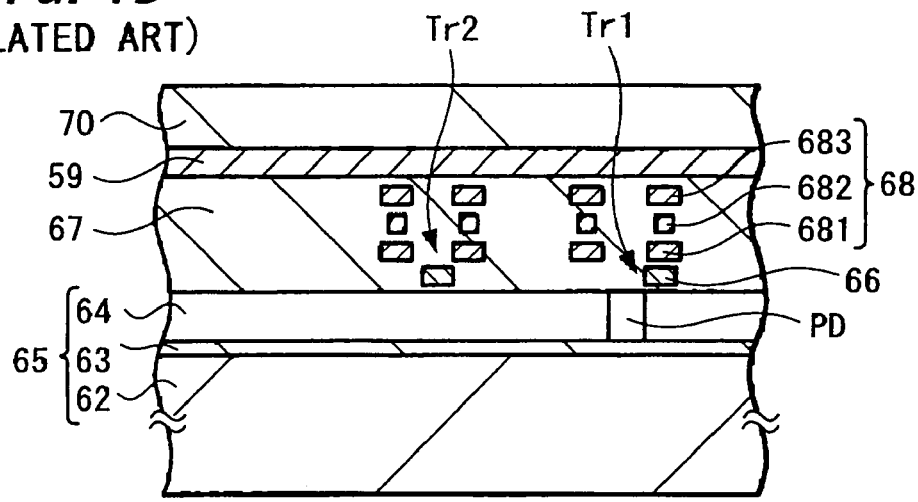
Figure 1E:
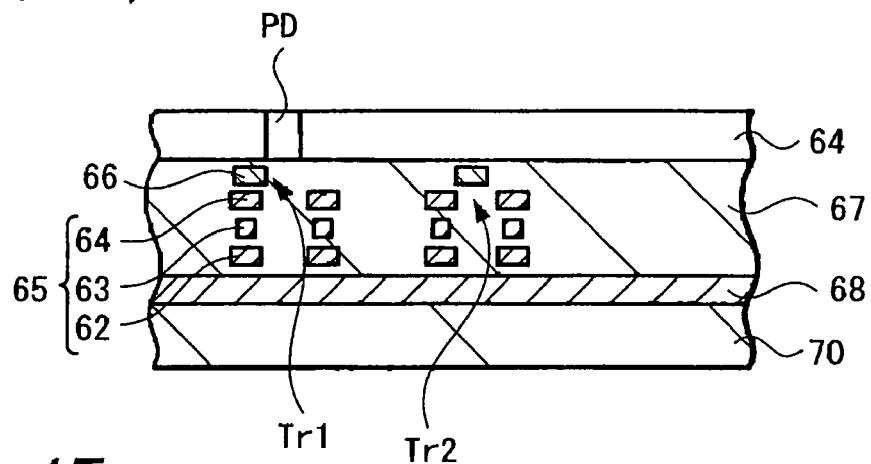
Figure 1F:
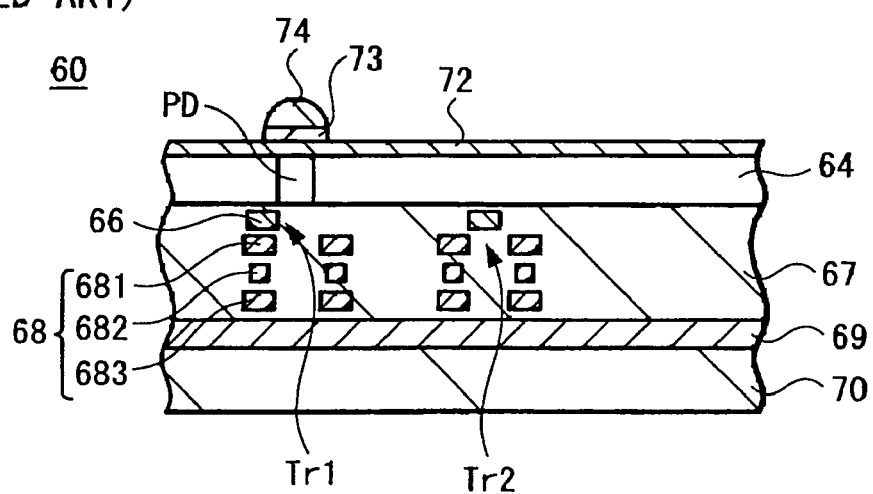
Figure 2:
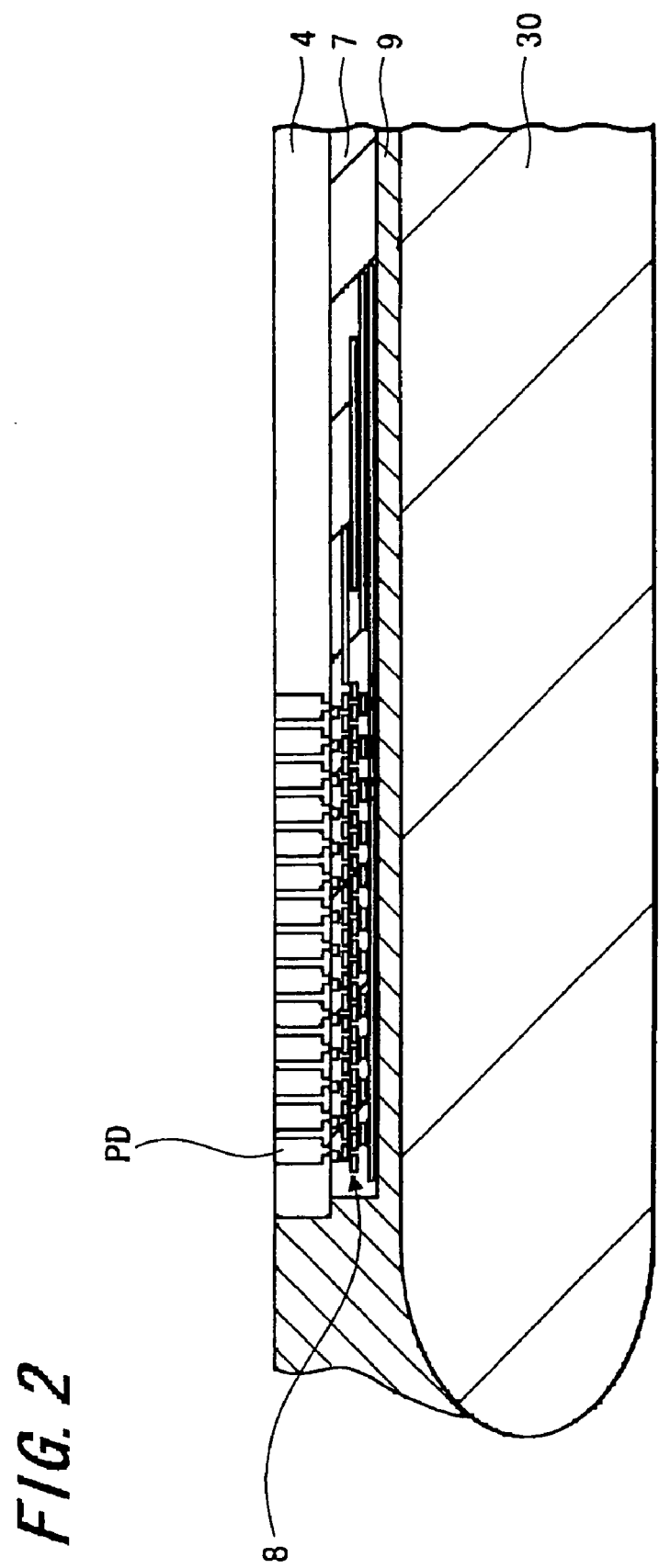
FIG. 2 is a schematic cross-sectional view showing a solid-state image pickup device according to an embodiment of the present invention.
Figure 3:
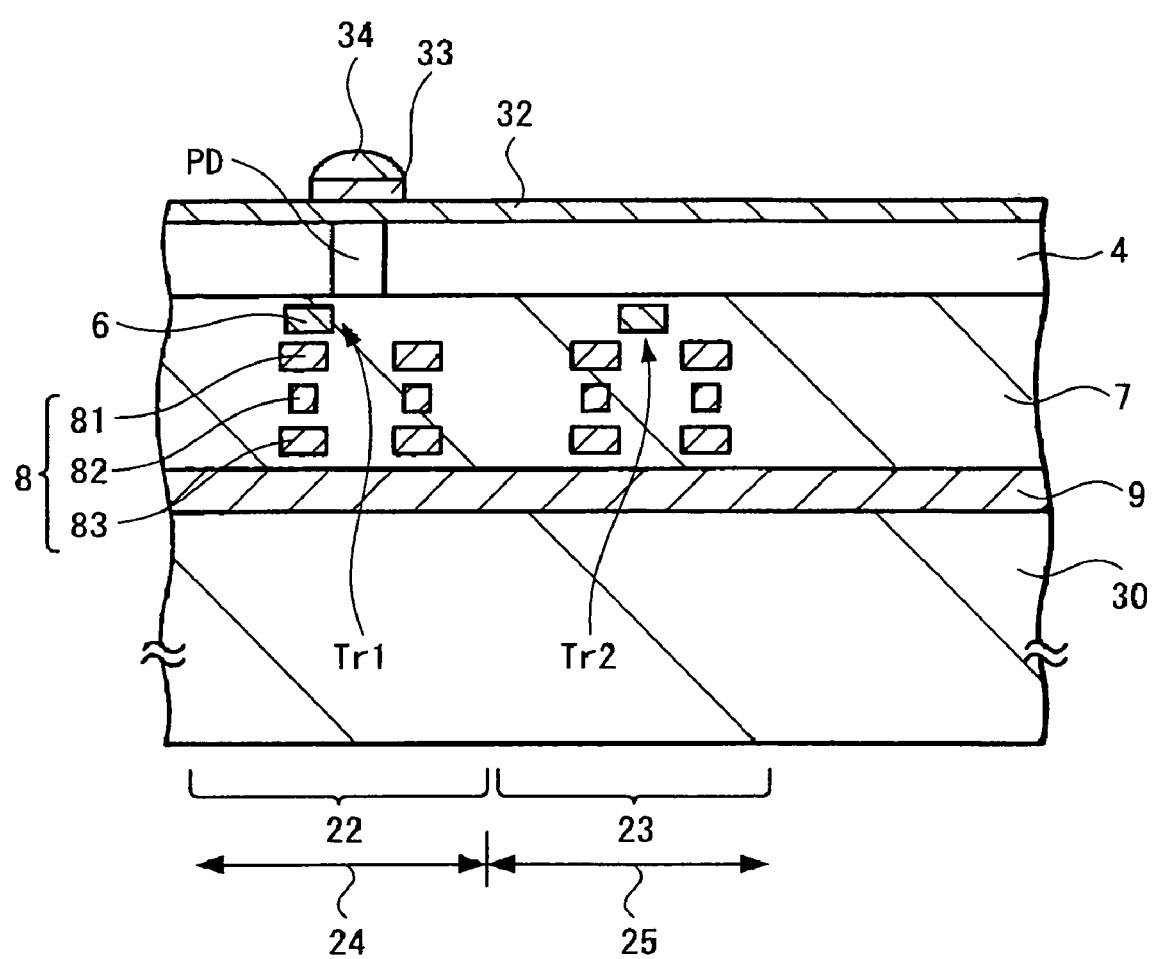
FIG. 3 is a cross-sectional view showing a main portion of FIG. 2 in an enlarged-scale.

FIG. 2 is a schematic diagram (cross-sectional view) of a CMOS type solid-state image pickup device, and FIG. 3 is a cross-sectional view showing a main portion of FIG. 2 in an enlarged-scale. A color filter and an on-chip microlens are not shown in FIG. 2.

As shown in FIGS. 2 and 3, in a CMOS type solid-state image pickup device 10 according to the embodiment of the present invention, an image pickup region 24 includes a single, crystal silicon layer (semiconductor substrate) 4 in which unit pixels 22, each of which is composed of a photoelectric conversion element (photodiode PD) and a plurality of MOS type transistors Tr1, are arranged in an XY matrix fashion (two-dimensional fashion). Further, in a peripheral region 25, a peripheral circuit portion 23 composed of a plurality of CMOS type transistors Tr2 is formed on the semiconductor substrate 4.

Although not shown, in addition to the image pickup region 24 and the peripheral region 25, there is formed a region in which a pad connected to an external interconnection, for example, is provided.

The MOS type transistor Tr1 formed on the unit pixel 22 has an arrangement in which a gate electrode 6 is formed between a pair of a source region and a drain region (not shown) formed on the semiconductor substrate 4 through a gate insulating film.

Also, the CMOS type transistor Tr2 of the peripheral circuit portion 23 has the similar arrangement in which a gate electrode 6 is formed between a pair of a source region and a drain region (not shown) formed on the semiconductor substrate 4 through a gate insulating film.

A multilayer interconnection layer 8 (81, 82, 83) is formed on the surface side (lower side in FIG. 3) of the image pickup region 24 and the peripheral region 25 of the semiconductor substrate 4.

On the other hand, a antireflection film, a planarized film and the like are formed on the back side (in the upper side of FIG. 3) of the semiconductor substrate 4 through the insulating film 32, and the on-chip microlens 34 is formed on the semiconductor substrate 4 through the color filter 33 in correspondence with the photodiode PD of each unit pixel 22.

In the CMOS type solid-state image pickup device 10 having such an arrangement, light is irradiated on the photodiode PD from the back side of the semiconductor substrate 4 through the on-chip microlens 34.

Then, in the solid-stage image pickup device 10 according to this embodiment, in particular, the adhesive layer 9 is made of a material that can be cured at a temperature lower than a deterioration starting temperature of the interconnection layer 8 (81, 82, 83) previously formed on the semiconductor substrate 4 and which is made of a material with low heat-resistance (for example, Al or Cu).

To be more concrete, when the interconnection layer 8 is made of Al or Cu, for example, the adhesive layer 9 is made of a material that can be cured at a temperature lower than 450° C.

A coating film made of benzocyclobutene (BCB), for example, is available as such material.

Benzocyclobutene has properties in which a crosslinking reaction (curing) proceeds at a low temperature ranging of from 150° C. to 250° C.

Figure 4A:
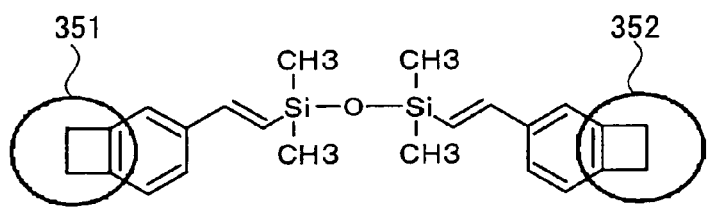
FIGS. 4A to 4C are diagrams of chemical formulas used to explain progress of a crosslinking reaction, respectively.
Figure 4B:
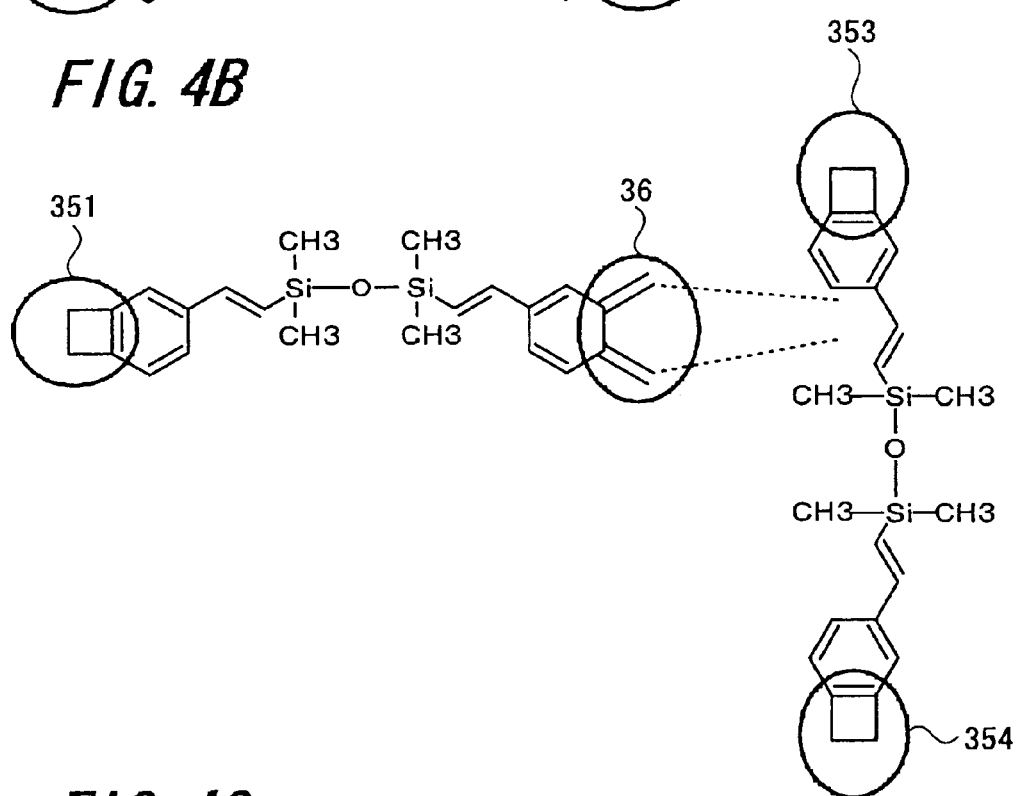
Figure 4C:
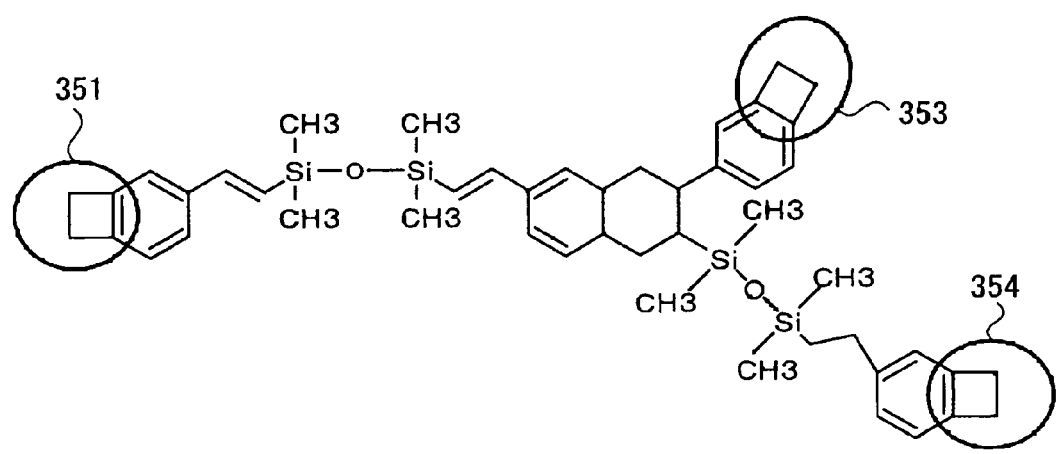

The progress of the crosslinking reaction will hereinafter be described with reference to curing reaction formulas of benzocyclobutene shown in FIGS. 4A to 4C. FIGS. 4A to 4C show curing reaction formulas in somewhere of the progress of the crosslinking reaction, respectively.

A structural formula of benzocyclobutene in the state in which it is not processed by heat treatment (that is, monomer) is expressed as shown in FIG. 4A. In the state (monomer state) shown in FIG. 4A, cyclobutene rings 351, 352 are bonded to respective benzene rings, respectively.

Next, with application of heat treatment, a ring opening reaction occurs in the cyclobutene ring 352 and a carbon double-bond 36 is formed as shown in FIG. 4B. Then, other benzocyclobutene. is bonded to this carbon double-bond (Deils-Alder reaction). The ring opening reaction is started at a temperature of approximately 150° C. and its chemical reaction is made active at a temperature in excess of 200° C.

As a result, as shown in FIG. 4C, there is exhibited the state in which benzocyclobutene is polymerized. In the state shown in FIG. 4C, the cyclobutene rings 351, 352 and 354 are respectively bonded to the respective benzene rings.

In accordance with a further progress of heat treatment, the respective reactions shown in FIGS. 4A to 4C are being repeated, thereby resulting in benzocyclobutene being cured progressively.

In addition to the above-mentioned properties, benzocyclobutene has properties in which it becomes low in viscosity with application of heat treatment. In this case, since reflowing properties can be enhanced, it becomes possible to planarize the substrate, for example.

Also, since benzocyclobutene has high chemical-resistance, it is difficult to be corroded (etched) by liquid medicine and hence bonding strength can be maintained.

As described above, according to the solid-state image pickup device 10 of this embodiment, since the adhesive layer 9 is made of benzocyclobutene which can be cured at the temperature ranging of from 150° C. to 250° C. lower than the deterioration starting temperature of the previously-formed interconnection layer 8 (81, 82, 83), in the manufacturing process which will be described later on, when the supporting substrate 4 is bonded to the single crystal silicon layer 4, it becomes possible to protect the interconnection layer 8 (81, 82, 83) made of Al or Cu which is low in heat-resistance from being affected thermally even with application of heat treatment for curing the adhesive layer 9.

Also, since benzocyclobutene becomes low in viscosity and it becomes high in reflowing properties with application of heat treatment, it becomes possible to improve the close contact between the insulating layer 7 and the supporting substrate 30. As a result, it becomes possible to suppress the occurrence of holes, voids and the like at the interface between the insulating layer 7 and the supporting substrate 30 are bonded together.

Further, since the surface of the insulating layer 7 can be planarized, it becomes possible to bond the insulating layer 7 and the supporting substrate 30 together with flatness.

Next, a method of manufacturing the solid-state image pickup device 10 having the above-mentioned arrangement will be described with reference to FIGS. 5A to 5G. In FIGS. 5A to 5G, elements and parts identical to those of FIGS. 2 and 3 are marked with identical reference numerals and therefore need not be described.

Figure 5A:
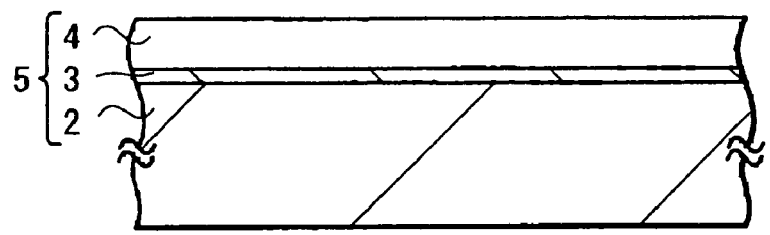
FIGS. 5A to 5G are manufacturing process diagrams showing a manufacturing method of a solid-state image pickup device shown in FIGS. 2 and 3, respectively.

First, as shown in FIG. 5A, an SOI substrate 5 with the single crystal silicon layer 4 formed thereon is prepared on the silicon substrate 2, for example, through the buried oxide film (so-called BOX layer) 3.

Film thicknesses of the buried oxide film 3 and the single crystal silicon layer 4 can be set arbitrarily.

Figure 5B:
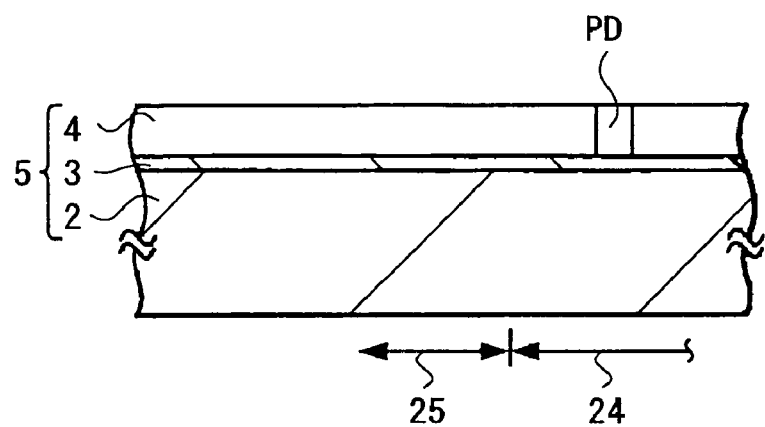

Next, as shown in FIG. 5B, the photodiode PD is formed on the SOI substrate 5 at the predetermined position within the single crystal silicon layer 4.

Figure 5C:
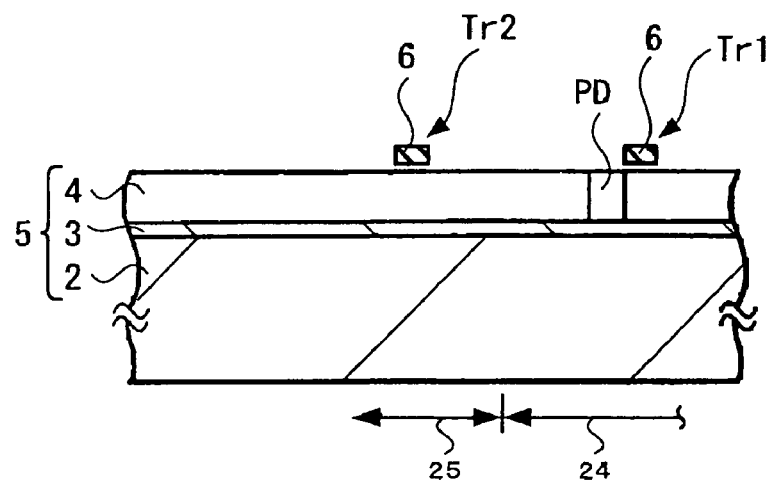

Next, the gate electrode 6 and the MOS type transistor Tr1 and the CMOS type transistor Tr2, each of which is composed of a pair of a source region and a drain region, though not shown, are formed on the image pickup region 24 and the peripheral region 25 of the single crystal silicon layer 4 through an insulating layer (not shown), thereby exhibiting the state shown in FIG. 5C.

Figure 5D:
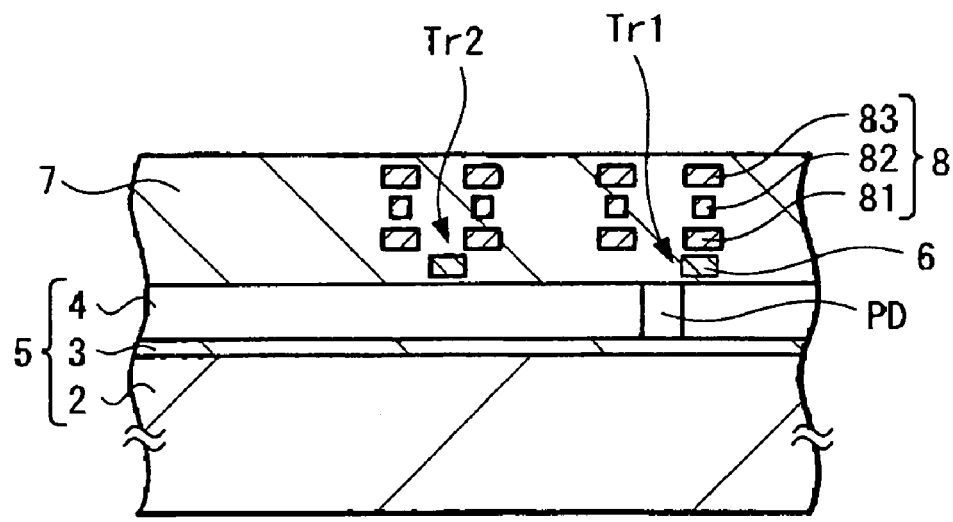

Next, as shown in FIG. 5D, the multilayer interconnection layer 8 is formed on the image pickup region 24 and the peripheral region 25 of the single crystal silicon layer 4.

More specifically, first, after the insulating layer 7 was formed on the image pickup region 24 and the peripheral region 25 of the single crystal silicon layer 4 and processed by planarization treatment, the interconnection layer 81 which becomes the first layer is formed with a predetermined pattern.

Next, after the insulating layer 7 was again formed on the whole surface including the interconnection layer 81 of the first layer and the electrode layer 29 and processed by planarization treatment, the interconnection layer 82 which becomes the second layer is formed with a predetermined pattern.

Next, after the insulating layer 7 was again formed on the whole surface including the interconnection layer 82 of the second layer and processed by planarization treatment, the interconnection layer 83 which becomes the third layer is formed with a predetermined pattern.

While the interconnection layer 8 has the trilayer structure as shown in FIG. 5D, when the interconnection layer 8 is formed so as to have a multilayer structure having layers more than three layer, the above-mentioned processes may be repeated.

Further, according to the need, it is possible that a planarized film formed of an SiN film, an SiON film and the like will be formed in the later process.

Figure 5E:
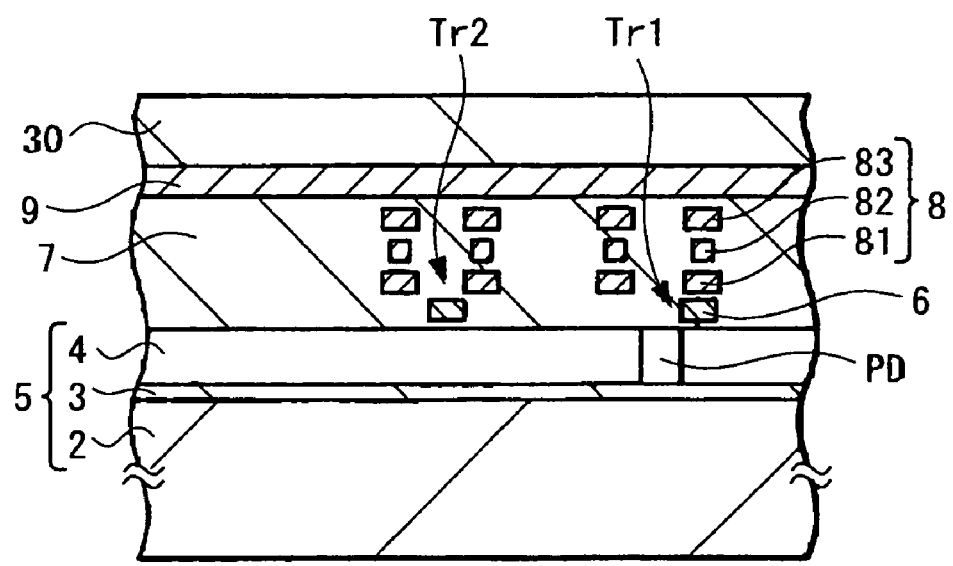

Next, as shown in FIG. 5E, the adhesive layer 9 is coated on the insulating layer 7 and the supporting substrate 30 is bonded to the insulating layer 7 through the adhesive layer 9.

In this embodiment, the adhesive layer 9 made of benzocyclobutene is formed and thereby the supporting substrate 30 is bonded to the insulating layer 7.

Then, the single crystal silicon layer 4 and the supporting substrate 30 bonded to each other by the adhesive layer 9 was heated and pressed with pressure within a vacuum chamber, whereby the adhesive layer 9 is cured to cause the single crystal silicon layer 4 and the supporting substrate 30 to contact with each other closely.

Under specific bonding conditions of a reduced-pressure atmosphere of $10^{-2}$ Torr and a heating temperature of 350° C., the single crystal silicon layer 4 and the supporting substrate 30 are bonded together by press treatment with pressure of 1000N for 5 minutes.

In that case, the adhesive layer 9 starts being cured in a low temperature region ranging of from 150° C. to 200° C. As a consequence, it is possible to prevent the interconnection layer 8 (81, 82, 83) made of the material (Al or Cu) with low heat-resistance that was previously formed on the semiconductor substrate 4 from being affected thermally.

Also, since the adhesive layer 9 is spread over a wide range of the insulating layer 7, uneven coated portions can be avoided and hence the close contact between the insulating layer 7 and the supporting substrate 30 can be increased. Further, difference in level produced on the surface of the insulating layer 7 can be restored and the surface of the insulating layer 7 can be made flat.

Figure 5F:
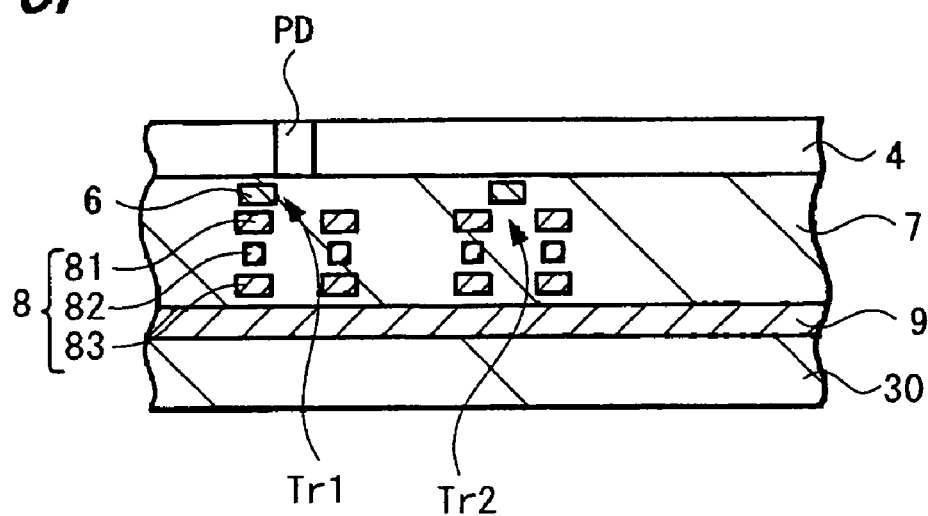

After that, the resultant product is inverted up and down and hence the back side of the SOI substrate 5, that is, the silicon substrate 2 is exposed. Then, the exposed silicon substrate 2 and the buried oxide film 3 are removed by a back-grinder method, for example, and thereby the film thickness is decreased to such one which falls within a range of from approximately 15 nm to 20 nm, for example. Thus, as shown in FIG. 5F, there is exhibited the state in which the single crystal silicon layer 4 of the SOI substrate 5 is exposed.

The film thickness can be decreased by not only the back-grinder method but also other suitable method such as a CMP (chemical mechanical polish) method and a wet etching process. When the wet etching process is in use, since benzocyclobutene has high chemical resistance, it is possible to prevent the adhesive layer 9 from being corroded (etched) by liquid medicine.

Figure 5G:
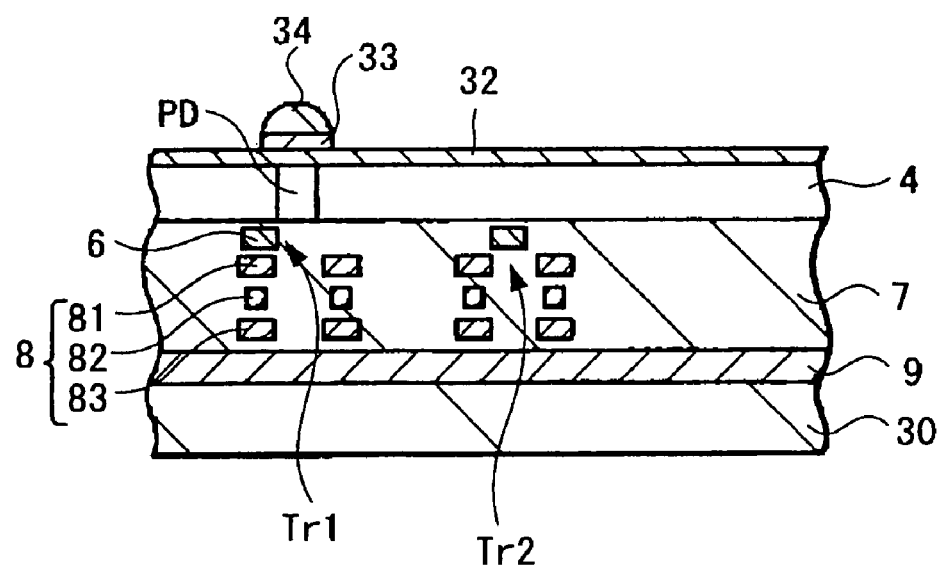

Then, as shown in FIG. 5G, an antireflection film, a planarized film and the like, for example, are formed on the back side of the single crystal silicon layer 4 and the on-chip microlens 34 is formed on the single crystal silicon layer 4 at the portion corresponding to the photodiode PD through the color filter 33.

In this manner, there can be manufactured the back-illuminated type CMOS solid-state image pickup device 10 having the arrangement shown in FIG. 3.

While the silicon substrate 2 and the buried oxide film 3 are removed and the single crystal silicon layer 4 of the SOI substrate 5 is exposed in the manufacturing processes shown in FIGS. 5E to 5F, the present invention is not limited thereto and the buried oxide film (insulating film) 3 can be left by removing only the silicon substrate 2.

According to the above-mentioned manufacturing method, as shown in FIG. 5E, since the coating film made of benzocyclobutene is formed on the insulating layer 7 as the adhesive layer 9 and the supporting substrate 30 is bonded to the insulating layer 7, curing of the coating film may proceed at the low temperature ranging of from 150° C. to 200° C. Thus, it is possible to suppress a thermal influence from being exerted upon the interconnection layer 8 (81, 82, 83) previously formed on the semiconductor substrate 4 and which is made of the material with low heat-resistance.

Also, since benzocyclobutene becomes low in viscosity with application of heat treatment and reflowing properties thereof can be enhanced, the adhesive layer 9 can be spread in a wide range between the insulating layer 7 and the supporting substrate 30, and the close contact between the insulating layer 7 and the supporting substrate 30 can be enhanced. Thus, high bonding strength can be maintained and it is possible to suppress the occurrence of holes, voids and the like on the interface between the insulating layer 7 and the supporting substrate 30.

Also, since difference in level on the surface of the insulating layer 7 can be restored and the surface of the insulating layer 7 can be made flat, the insulating layer 7 and the supporting substrate 30 can be bonded together with flatness.

Further, since the adhesive layer 9 can be prevented from being warped considerably unlike the case in which the adhesive tape is in use, the processes following the heat treatment can be carried out satisfactorily.

While benzocyclobutene is used as the coating film as set forth above, the present invention is not limited thereto and inorganic SOG and organic SOG, resist, polyimide or organic resin such as polyaryl ether can be used as the coating film.

Since such coating film is made of the material that can be cured at a temperature lower than 450° C. as described above, it is possible to suppress a thermal influence from being exerted upon the interconnection layer 8 (81, 82, 83), which was previously formed on the semiconductor substrate 4.

Hydrogen silsequioxane (HSQ) and polysilazane (PSZ), for example, can be enumerated as the inorganic SOG, and methylsilsequioxane (MSQ), a hybrid material of hydrogen silsequioxane and methylsilsequioxane and the like, for example, can be enumerated as the organic SOG.

Also, resist composed of a combination of cyclized polyisoprene, a novolac resin and a photosensitizer, for example, can be enumerated as the organic resin. Also, a resist composed of a combination of a photoacid generator, a crosslinking agent, a PHS-based resin, a novolac resin and a methacrylic-based resin and the like, for example, can be enumerated as a chemical amplification resist.

Polyaryl ether manufactured by The Dow Chemical Company under the trade name of "SiLK" and polyaryl ether manufactured by Honeywell Inc., under the trade names of "FLARE" and "GX-3" and the like can be enumerated as the above-mentioned polyaryl ether.

According to this embodiment, under the bonding conditions of the reduced-pressure atmosphere of $10^{-2}$ Torr and the heating temperature of 350° C., the insulating layer 7 and the supporting substrate 30 are heated and bonded by a press treatment at a pressure of 1000N for 5 minutes as set forth above.

With respect to the atmosphere, since the insulating layer 7 and the supporting substrate 30 are heated and pressed under the reduced-pressure atmosphere in order to remove gases such as a solvent produced from the coating film, the atmosphere can be optimized in response to the kind of the materials for use in the adhesive layer 9.

Also, the insulating layer 7 and the supporting substrate 30 are pressed by the press treatment with pressure in order to increase the close contact between the insulating layer 7 and the supporting substrate 30. When the thin-film forming process is carried out by the back-grinder method, for example, in order to increase resistance against grinding, pressure of at least larger than 500N is required, preferably, pressure ranging of from 500N to 2000N should be required.

Also, the heating temperature may be selected to be lower than the deterioration starting temperature of the material (Al, Cu) forming the interconnection layer 8 (81, 82, 83) formed on the surface side of the single crystal silicon layer 4, for example, the heating temperature may be selected to be lower than 450° C., preferably, it should be selected in a temperature range of from 350° C. to 400° C.

As described above, the conditions such as atmosphere, pressure, heating temperature and the like can be selected arbitrarily in response to the kind of the material for use in the adhesive layer 9.

While the coating film is used as the adhesive layer 9 to bond the single crystal silicon layer 4 and the supporting substrate 30 in this embodiment, the present invention is not limited thereto and a film (CVD film) deposited by a CVD method can be used as the adhesive layer 9.

An $SiO_2$ film deposited by a plasma enhanced method (PE-CVD method), an inorganic film deposited by a low-temperature CVD method and the like may be enumerated as this CVD film.

Further, if the CVD film is formed as the adhesive layer 9 as described above, then when the adhesive layer 9 is formed in the manufacturing process of the solid-state image pickup device 10 according to the above-mentioned embodiment, the $SiO_2$ film and the organic film may be formed by the PE-CVD method and the low-temperature CVD method.

Since curing of such CVD film proceeds at a temperature of approximately 400° C. similarly to the case of the above-mentioned coating film, it is possible to suppress a thermal influence from being exerted upon the interconnection layer 8 (81, 82, 83) made of the material with low heat-resistance.

Also, when the film-deposition conditions of the CVD film and the like are adjusted, reflowing properties can be enhanced similarly to the case of the coating film. Thus, the adhesive layer 9 can be spread in a wide range between the insulating layer 7 and the supporting substrate 30 and hence the close contact between the insulating layer 7 and the supporting substrate 30 can be increased. Therefore, since high bonding strength between the adhesive layer 9 and the supporting substrate 30 can be maintained, it is possible to suppress the occurrence of holes, voids and the like on the interface on which the adhesive layer 9 and the supporting substrate 30 are bonded together.

Also, since the difference in level on the surface of the insulating layer 7 can be restored and the surface of the insulating layer 7 can be made flat, the insulating layer 7 and the supporting substrate 30 can be bonded together with flatness.

The adhesive layer 9 is not limited thereto, and a film (silicide film) silicified by effecting the heat treatment on a metal film formed by a sputtering method can be used as the adhesive layer 9.

This silicide film can be formed by silicifying an Ni film in the heat treatment done upon bonding after the Ni film was formed on the single crystal silicon layer 4 by the sputtering method, for example.

Also in such silicide film, since reaction between metal (Ni) and silicon (Si) proceeds at a temperature ranging of from approximately 350° C. to 450° C., it becomes possible to suppress a thermal influence from being exerted upon the interconnection layer 8 (81, 82, 83) made of the material with low heat-resistance.

Next, a semiconductor integrated circuit device according to an embodiment of the present invention will hereinafter be described with reference to FIGS. 6 and 7.

Figure 6:
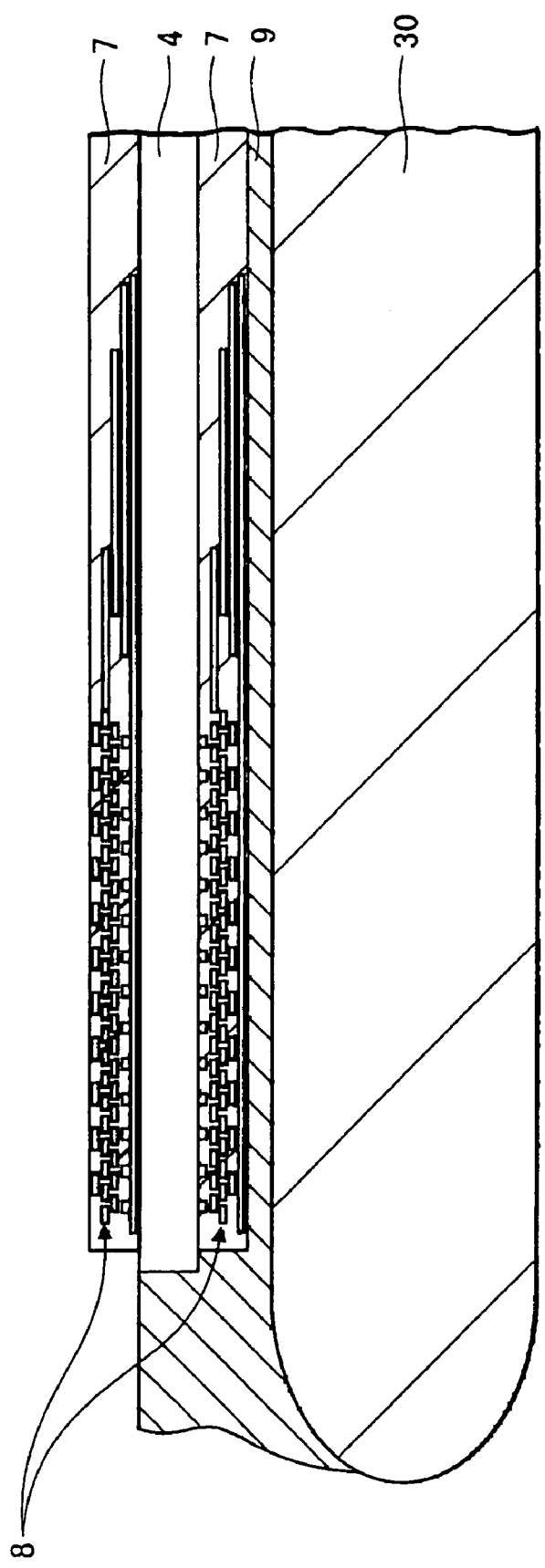
FIG. 6 is a schematic cross-sectional view showing a semiconductor integrated circuit device according to an embodiment of the present invention.
Figure 7:
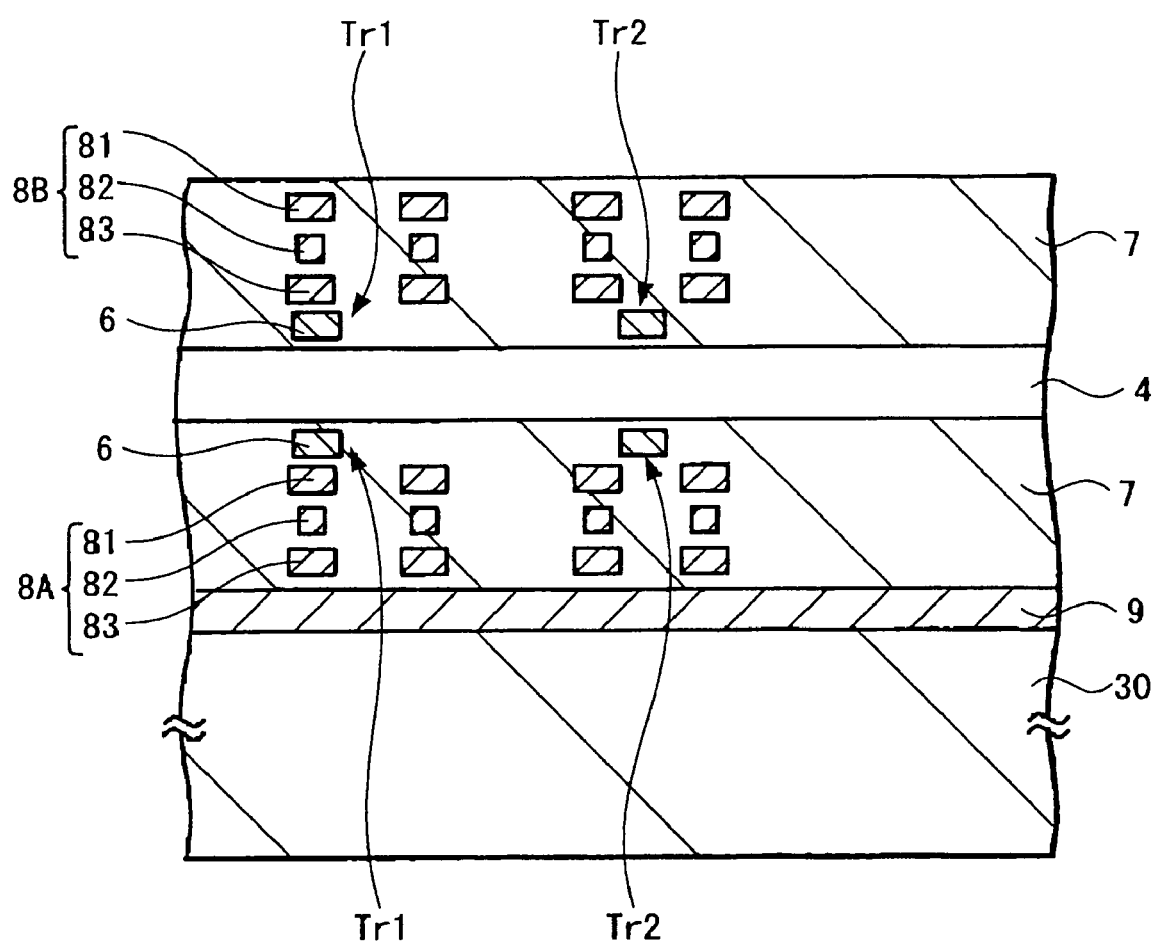
FIG. 7 is a cross-sectional view showing a main portion of FIG. 6 in an enlarged-scale.

FIG. 6 is a schematic diagram (cross-sectional view) of a semiconductor integrated circuit device and FIG. 7 is a cross-sectional view showing a main portion of FIG. 6 in an enlarged-scale.

As shown in FIGS. 6 and 7, in a semiconductor integrated circuit device 40 according to this embodiment, a plurality of MOS type transistors Tr1, Tr2 are formed at predetermined positions on one side of a single crystal silicon layer 4, that is, surface side (in the lower side of FIGS. 6 and 7), and a multilayer (for example, trilayer) interconnection layer 8A (81, 82, 83) is formed on these transistors Tr1, Tr2 through an insulating layer 7.

Also, on the other side, that is, on the back side (in the upper side of FIG. 7), a plurality of MOS type transistors Tr1, Tr2 are formed on the single crystal silicon layer 4 at its regions in which the transistors Tr1, Tr2 are formed. A multilayer (for example, trilayer) interconnection layer 8B (81, 82, 83) is formed on these transistors Tr1, Tr2 through the insulating layer 7.

Each of the MOS type transistors Tr1, Tr2 formed on the surface side and the back side has an arrangement in which a gate electrode 6 is formed on a pair of a source region and a drain region formed in the single crystal silicon layer 4 through a gate insulating film.

The source region and the drain region of each of the transistors Tr1, Tr2 and a channel region are formed at the predetermined positions in the single crystal silicon layer 4, although not shown.

Then, a supporting substrate 30 formed of a silicon substrate and the like, for example, is bonded to the interconnection layer 8A on the surface side through an adhesive layer 9.

Then, in the semiconductor integrated circuit device 40 according to this embodiment, the adhesive layer 9, in particular, is made of benzocyclobutene similarly to the case of the above-mentioned solid-state image pickup device.

Specific properties of benzocyclobutene are the same as those described above and therefore need not be described.

According to the semiconductor integrated circuit device 40 having the above-mentioned arrangement of this embodiment, since the adhesive layer 9 is made of benzocyclobutene which can be cured at a temperature ranging of from 150° C. to 250° C. which is lower than the deterioration starting temperature of the previously-formed interconnection layer 8A (81, 82, 83), when the supporting substrate 30 is bonded to the single crystal silicon layer 4 in the manufacturing process which will be described later on, it becomes possible to prevent a thermal influence from being exerted upon the interconnection layer 8A (81, 82, 83) made of Al or Cu with low heat-resistance even though it is processed by the heat treatment.

Also, since benzocyclobutene becomes low in viscosity and it becomes high in reflowing properties with application of the heat treatment, the close contact between the insulating layer 7 and the supporting substrate 30 can be increased. As a result, it becomes possible to suppress the occurrence of holes, voids and the like at the interface between the insulating layer 7 and the supporting substrate 30.

Also, since the surface of the insulating layer 7, for example, can be made flat, the insulating layer 7 and the supporting substrate 30 can be bonded together with flatness.

Next, a method of manufacturing the semiconductor integrated circuit device 40 having such arrangement will be described with reference to FIGS. 8A to 8G. In FIGS. 8A to 8G, elements and parts identical to those of FIGS. 6 and 7 are denoted by identical reference numerals.

Figure 8A:
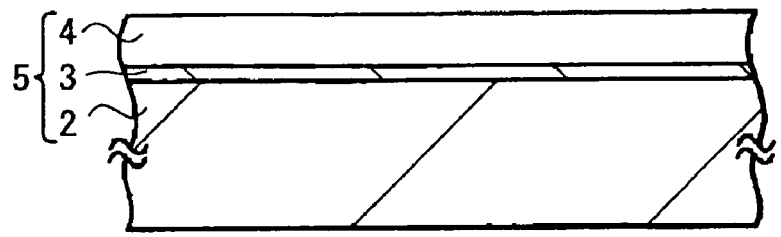
FIGS. 8A to 8G are manufacturing process diagrams showing a manufacturing method of a semiconductor integrated circuit device shown in FIGS. 6 and 7, respectively.

First, as shown in FIG. 8A, the SOI substrate 5 with the single crystal silicon layer 4 formed thereon is prepared on the silicon substrate 2, for example, through the buried oxide film (so-called BOX layer) 3.

Film thicknesses of the buried oxide film 3 and the single crystal silicon layer 4 may be set arbitrarily.

Figure 8B:
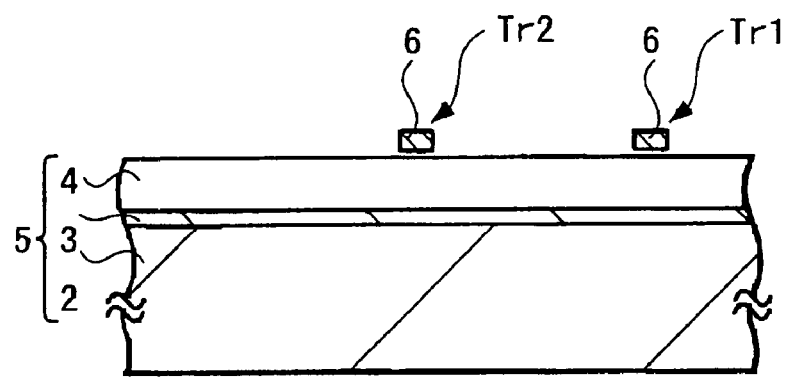

Next, the gate electrode 6 and the MOS type transistors Tr1, Tr2, each being composed of a pair of a source region and a drain region, are formed on the SOI substrate 5 at its region 27 in which each transistor of the single crystal silicon layer 4 is formed through the insulating layer 7, thereby exhibiting the state shown in FIG. 8B.

Figure 8C:
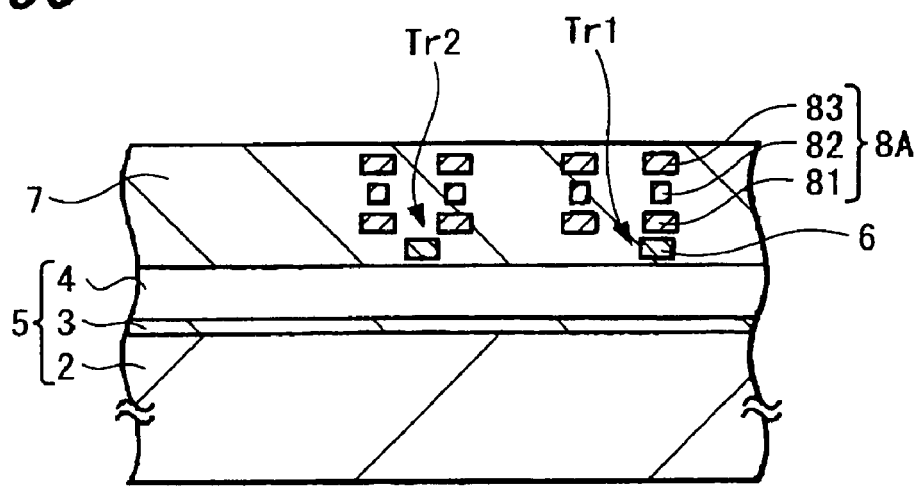

Next, the multilayer interconnection layer 8A (81, 82, 83) is formed on the single crystal silicon layer 4 at its region in which the transistors Tr1, Tr2 are formed, that is, on the surface side of the single crystal silicon layer 4 through the insulating layer 7, thereby exhibiting the state shown in FIG. 8C.

Specific methods of forming the respective transistors Tr1, Tr2 and the interconnection layer 8A are similar to those of the case in which the solid-state image pickup device according to the aforementioned embodiment is manufactured and therefore need not be described.

Figure 8D:
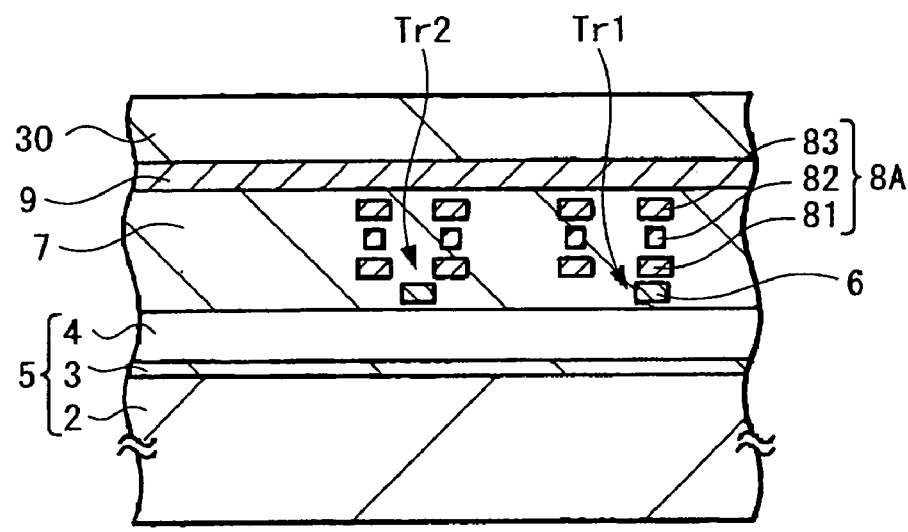

Next, the adhesive layer 9 is coated on the planarized film and the supporting substrate 30 is bonded to the adhesive layer 9, thereby exhibiting the state shown in FIG. 8D.

In this embodiment, the adhesive layer 9 made of benzocyclobutene is formed and the supporting substrate 30 is bonded to the adhesive layer 9 similarly to the case in which the above-mentioned solid-state image pickup device is manufactured.

The bonding conditions are similar to those of the case in which the above-mentioned solid-state image pickup device is manufactured and therefore need not be described.

In that case, the adhesive layer 9 starts being cured in a low temperature region ranging of from 150° C. to 200° C. Thus, it is possible to prevent a thermal influence from being exerted upon the interconnection layer 8A (81, 82, 83) made of the material (Al or Cu) with low heat-resistance previously-formed on the semiconductor substrate 4.

Further, since the adhesive layer 9 is spread in a wide range of the insulating layer 7, uneven coated portions can be prevented from being produced, and the close contact between the insulating layer 7 and the supporting substrate 30 can be increased. Also, the difference in level on the surface of the insulating layer 7 can be restored and the surface of the insulating layer 7 can be made flat.

Figure 8E:
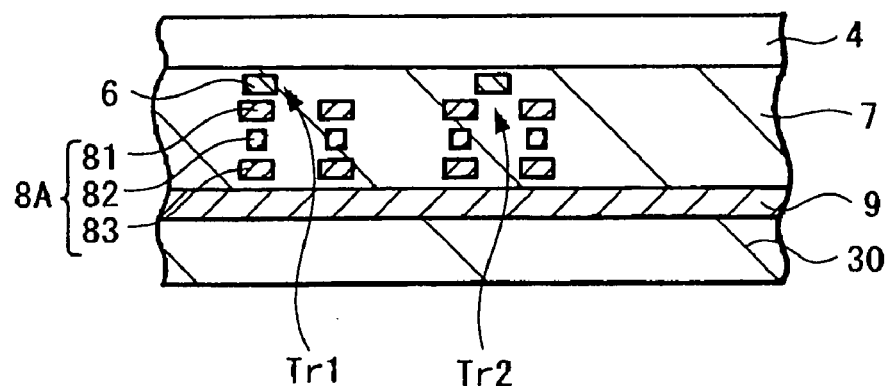

Next, when the resultant product is inverted up and down, the back side of the SOI substrate 5, that is, the silicon substrate 2 is exposed. Then, the exposed silicon substrate 2 and the buried oxide film 3 are removed from the back side by a back-grinder method, for example, and thereby the film thickness of the semiconductor substrate is decreased to about 15 nm to 20 nm. As a result, as shown in FIG. 8E, the single crystal silicon layer 4 of the SOI substrate 5 is exposed.

The film thickness of the semiconductor substrate can be decreased by not only the back-grinder method but also other suitable method such as the CMP method and the wet etching process. When the wet etching process is used, for example, since benzocyclobutene has high chemical resistant property, it is possible to prevent the adhesive layer 9 from being corroded (etched) by liquid medicine.

Figure 8F:
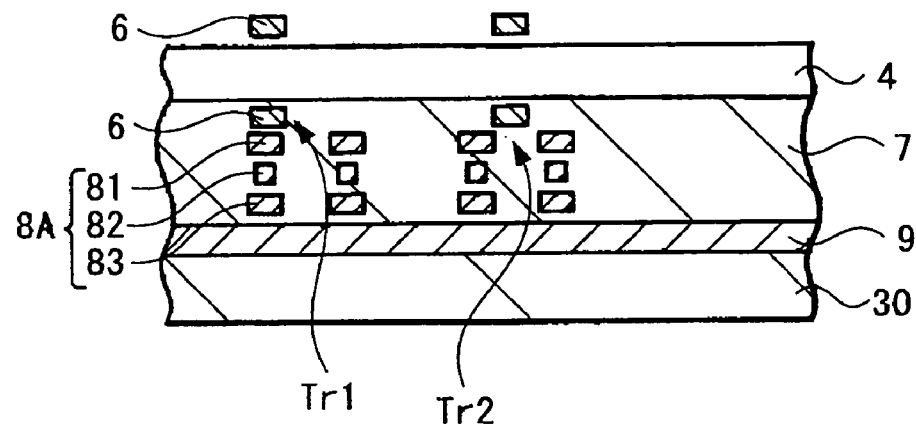

Next, the gate electrode 6 and the MOS type transistors Tr1, Tr2, each composed of a pair of a source region and a drain region, are formed on the single crystal silicon layer 4 at its position in which the transistors Tr1, Tr2 are formed, that is, on the back side of the single crystal silicon layer 4 through the insulating layer 7, respectively, thereby exhibiting the state shown in FIG. 8F.

Figure 8G:
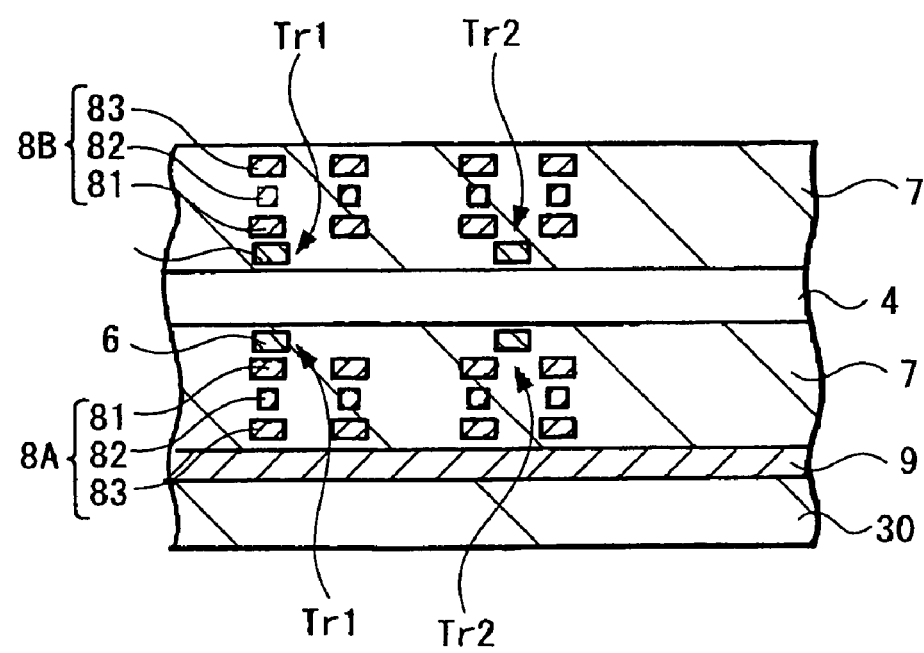

Next, the multilayer interconnection layer 8B (81, 82, 83) is formed on the single crystal silicon layer 4 at its region in which the transistors Tr1, Tr2 are formed through the insulating layer 7, thereby exhibiting the state shown in FIG. 8G.

Specific methods for forming the respective transistors Tr1, Tr2 and the interconnection layer 8B are similar to those required when the solid-state image pickup device according to the aforementioned embodiment is manufactured and therefore need not be described.

In this manner, there can be manufactured the semiconductor integrated circuit device 40 shown in FIG. 7.

While the single crystal silicon layer 4 of the SOI substrate 5 is exposed by removing the silicon substrate 2 and the buried oxide film 3 in the above-mentioned processes shown in FIGS. 8D and 8E, the present invention is not limited thereto and such a variant is also possible, in which only the silicon substrate 2 is removed, the buried oxide film (insulating film) being left.

According to the above-mentioned manufacturing method, as shown in FIG. 8D, since the coating film made of benzocyclobutene is formed on the insulating layer 7 as the adhesive layer 9 and the supporting substrate 30 is bonded to the insulating layer 7 as described above, curing of the coated film can proceed at the low temperature ranging of from 150° C. to 200° C. Consequently, it is possible to suppress a thermal influence from being exerted upon the interconnection layer 8A (81, 82, 83) previously formed on the semiconductor substrate 4 and which is made of the material with low heat-resistance.

Also, since benzocyclobutene becomes low in viscosity with application of the heat treatment and it becomes high in reflowing properties, the adhesive layer 9 can be spread in a wide range between the insulating layer 7 and the supporting substrate 30. As a consequence, since the close contact between the insulating layer 7 and the supporting substrate 30 can be increased and high bonding strength can be maintained, it is possible to suppress the occurrence of holes, voids and the like at the interface between the insulating layer 7 and the supporting substrate 30.

Also, since the difference in level on the surface of the insulating layer 7 can be restored and the surface of the insulating layer 7 can be made flat, the insulating layer 7 and the supporting substrate 30 can be bonded together with flatness.

While benzocyclobutene is used as the adhesive layer 9 similarly to the aforementioned embodiment of the solid-state image pickup device according to this embodiment, the present invention is not limited thereto and inorganic SOG and organic SOG and a resist, polyimide or an organic resist such as polyaryl ether can be used.

Since these materials are those which can be cured at a temperature lower than 450° C. as described above, it is possible to suppress a thermal influence from being exerted upon the interconnection layer 8A (81, 82, 83) that was previously formed on the surface side of the semiconductor substrate 4.

Specific kinds of inorganic SOG, organic SOG, an organic resin and the like are similar to those of the solid-state image pickup device according to the aforementioned embodiment and therefore need not be described.

Further, also in this embodiment, under the bonding conditions of the reduced-pressure atmosphere of $10^{-2}$ Torr and the heating temperature of 350° C., the insulating layer 7 and the supporting substrate 30 are bonded by the press-treatment with pressure of 1000N for 5 minutes.

However, the atmosphere, pressure, heating temperature and the like can be arbitrarily selected in response to the kind of the material for use in the adhesive layer 9 similarly to the case in which the aforementioned solid-state image pickup device is manufactured.

Also, the film (CVD film) formed by the CVD method can be used as the adhesive layer 9 similarly to the case of the aforementioned solid-state image pickup device 10.

The $SiO_2$ film deposited by the plasma-enhanced method (PE-CVD method), the organic film deposited by the low-temperature CVD method and the like can be used as the CVD film as mentioned hereinbefore.

As described above, if the CVD film is formed as the adhesive layer 9, then when the adhesive layer 9 is formed (see FIG. 8D) upon manufacturing of the semiconductor integrated circuit device 40 shown in FIGS. 8A to 8G, it is sufficient that the $SiO_2$ film or the organic film may be formed by using the PE-CVD method and the low-temperature CVD method.

Since curing of such CVD film proceeds at a temperature of approximately 400° C., it is possible to suppress a thermal influence from being exerted upon the interconnection layer 8A (81, 82, 83) made of the material with low heat-resistance.

Also, when the film-deposition conditions of the CVD method and the like are adjusted, since reflowing properties can be enhanced, as described above, high bonding strength between the adhesive layer 9 and the supporting substrate 30 can be maintained and it is possible to suppress the occurrence of holes, voids and the like on the interface between the insulating layer 7 and the supporting substrate 30. Further, in addition, the insulating layer 7 and the supporting substrate 30 can be bonded together with flatness.

Also, the adhesive layer 9 is not limited thereto and it is possible to use a film (silicide film) silicified by annealing the metal film formed by a sputtering method similarly to the case of the aforementioned solid-state image pickup device 10.

This silicide film can be formed by silicifying an Ni film by the heat treatment used in the bonding process after the Ni film was formed on the single crystal silicon layer 4 by a sputtering method, for example, in the process shown in FIG. 8D when the semiconductor integrated circuit device 40 shown in FIGS. 8A to 8G is manufactured.

Also in such silicide film, since reaction between the metal (Ni) and the silicon (Si) proceeds at a temperature ranging of from approximately 350° C. to 450° C., it becomes possible to suppress a thermal influence from being exerted upon the interconnection layer 8A (81, 82, 83) made of the material with low heat-resistance.

Figure 9:
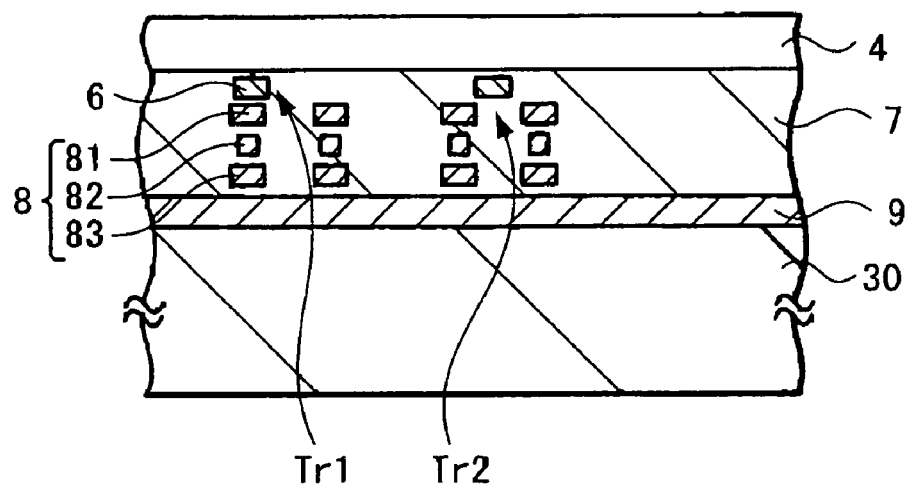
FIG. 9 is a schematic cross-sectional view showing a semiconductor integrated circuit device according to other embodiment of the present invention.

When the semiconductor integrated circuit device 40 according to the above-mentioned embodiment is manufactured, we have so far described the case in which the semiconductor integrated circuit device 40 (see FIG. 6) having the arrangement in which the respective transistors Tr1, Tr2 and the interconnection layers 8A, 8B are formed on the surface side and the back side of the single crystal silicon layer 4 is manufactured, by way of example. The present invention is not limited thereto and the present invention can be applied to the case in which a semiconductor integrated circuit device 41 having an arrangement in which the respective transistors Tr1, Tr2 and the interconnection layer 8A is formed on only the surface side of the single crystal silicon layer 4 as shown in FIG. 9 is manufactured.

When the semiconductor integrated circuit device 41 having the above-mentioned arrangement is manufactured, the processes shown in FIGS. 8F and 8G, that is, the processes in which the respective transistors Tr1, Tr2 and the interconnection layer 8B (81, 82, 83) are formed on the back side of the single crystal silicon layer 4 need not be carried out in the case of manufacturing the semiconductor integrated circuit device 40 shown in FIGS. 8A to 8G.

Also in this case, in the process shown in FIG. 8D, since benzocyclobutene and aforementioned other respective materials are used as the adhesive layer 9 so that curing of the adhesive layer 9 proceeds at a temperature lower than 450° C., it is possible to suppress a thermal influence from being exerted upon the interconnection layer 8A (81, 82, 83) previously formed on the surface side of the single crystal silicon layer 4 and which is made of the material with low heat-resistance.

Also, since the close contact between the insulating layer 7 and the supporting substrate 30 can be increased, high bonding strength can be maintained and it is possible to suppress the occurrence of holes, voids and the like on the interface between the insulating layer 7 and the supporting substrate 30. Further, since the difference in level on the surface of the insulating layer 7 can be restored and the surface of the insulating layer 7 can be made flat, the insulating layer 7 and the supporting substrate 30 can be bonded together with flatness.

Figure 10:
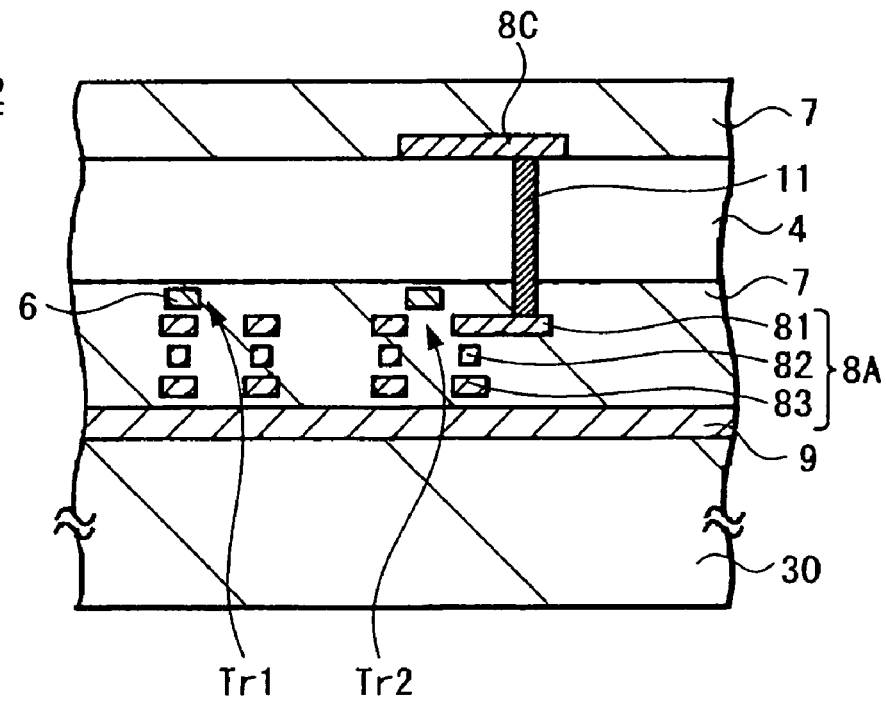
FIG. 10 is a schematic cross-sectional view showing a semiconductor integrated circuit device according to a further embodiment of the present invention.

Also, as shown in FIG. 10, the present invention can be applied to a semiconductor integrated circuit device 42 in which an interconnection layer 8C connected to the interconnection layer 8A through a contact interconnection 11 is provided on the insulating layer 7 in the arrangement in which the respective transistors Tr1, Tr2 and the interconnection layer 8A are formed on only the surface side of the single crystal silicon layer 4 similarly to the semiconductor integrated circuit device 41 shown in FIG. 9.

When the semiconductor integrated circuit device 42 having the above-mentioned arrangement is manufactured, in the case of manufacturing the semiconductor integrated circuit device 40 shown in FIGS. 8A to 8G, as shown in FIG. 8E, after the interconnection layer 8A (81, 82, 83) was formed on the surface side of the single crystal silicon layer 4, the contact interconnection 11 may be formed within the single crystal silicon layer 4 at its position corresponding to the interconnection layer 81, for example, and the interconnection layer 8C may be formed so as to be connected to this contact interconnection 11.

Also in this case, in the process shown in FIG. 8D, since benzocyclobutene and aforementioned other materials are used as the adhesive layer 9 so that curing of the adhesive layer 9 proceeds at a temperature lower than 450° C., it is possible to suppress a thermal influence from being exerted upon the interconnection layer 8 (81, 82, 83) previously formed on the surface of the semiconductor substrate 4 and which is made of the material with low heat-resistance.

Also, since the close contact between the insulating layer 7 and the supporting substrate 30 can be increased, high bonding strength between the insulating layer 7 and the supporting substrate 30 can be maintained and it is possible to suppress the occurrence of holes, voids and the like on the interface between the insulating layer 7 and the supporting substrate 30. Further, since the difference in level on the surface of the insulating layer 7 can be restored and the surface of the insulating layer 7 can be made flat, the insulating layer 7 and the supporting substrate 30 can be bonded together with flatness.

While the present invention has been described with reference to the case in which the solid-state image pickup device and the semiconductor integrated circuit device are manufactured from the SOI substrate 5 composed of a plurality of layers in which the single crystal silicon layers 4 are laminated on the silicon substrate 2 through the buried oxide film (insulating film) 3, the present invention can also be applied to the case in which the above-mentioned solid-state image pickup device and the semiconductor integrated circuit device are manufactured from a semiconductor substrate of a single layer.

Figure 11:
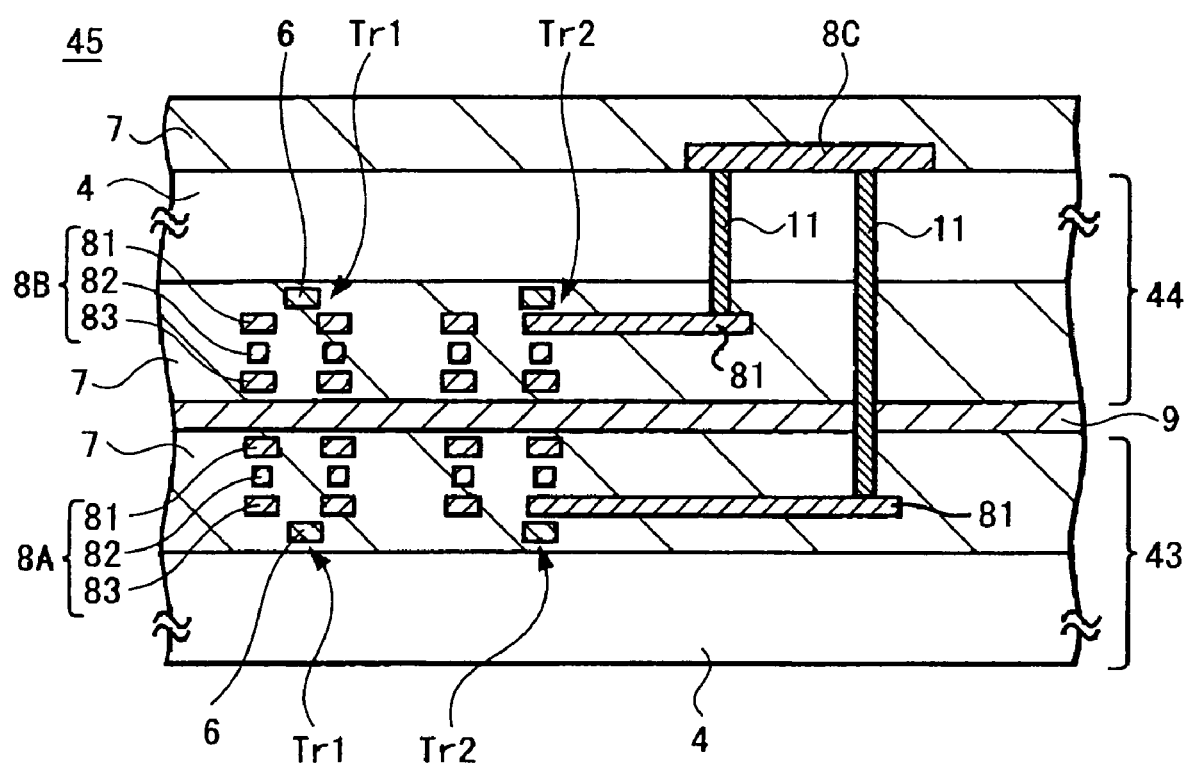
FIG. 11 is a schematic cross-sectional view showing a semiconductor integrated circuit device according to yet a further embodiment of the present invention.

On the other hand, the present invention can also be applied to the case in which a semiconductor integrated circuit device 45 having an arrangement shown in FIG. 11 is manufactured.

As shown in FIG. 11, in this semiconductor integrated circuit device 45, a first semiconductor integrated circuit device 43 having an arrangement in which the respective transistors Tr1, Tr2 and the interconnection layer 8A are formed on the surface side of the semiconductor substrate 4 composed of a suitable layer such as a single crystal silicon layer and a second semiconductor integrated circuit device 44 having an arrangement in which the respective transistors Tr1, Tr2 and the interconnection layer 8A are formed on the surface side of the semiconductor substrate 4 are bonded together through the adhesive layer 9.

Then, the interconnection layer 8A (first interconnection layer 81) of the first semiconductor integrated circuit device 43 and the interconnection layer 8B (first interconnection layer 81) of the second semiconductor integrated circuit device 44 and the interconnection layer 8C formed within the insulating layer 7 on the semiconductor substrate 4 of the second semiconductor integrated circuit device 44 are respectively connected through the contact interconnections 11.

When the semiconductor integrated circuit device 45 having the above-mentioned arrangement is manufactured, the respective transistors Tr1, Tr2 composed of the gate electrode 6 and a pair of a source region and a drain region and the interconnection layers 8A, 8B are respectively formed on the surface side of the semiconductor substrate 4 by a conventional method, thereby forming the first and second semiconductor integrated circuit device 43 and 44, although not shown.

Next, the insulating layers 7 of the first and second semiconductor integrated circuit device 43 and 44 are opposed to each other and they are thereby bonded together through the adhesive layer 9.

Then, after the contact interconnection 11 reaching the interconnection layer 8B (first interconnection layer 81) from the surface (in the upper side of FIG. 11) of the semiconductor substrate 4 of the second semiconductor integrated circuit device 44 and the contact interconnection 11 reaching the interconnection layer 8A (first interconnection layer 81) of the first semiconductor integrated circuit device 43 from the surface of the semiconductor substrate 4 of the second semiconductor integrated circuit device 44 were respectively formed, they are connected to the contact interconnection 11 to form the interconnection layer 8C.

Thus, it is possible to manufacture the semiconductor integrated circuit device 45 shown in FIG. 11.

In the semiconductor integrated circuit device 45 with the arrangement shown in FIG. 11, both of the two single crystal silicon layers 4 need not always be decreased in film thickness. In this case, it is possible that the SOI substrate may not be used upon manufacturing.

Also in this case, since benzocyclobutene and aforementioned other materials are used as the adhesive layer 9 so that curing of the adhesive layer 9 can proceed at a temperature lower than 450° C., it is possible to suppress thermal influence from being exerted upon the interconnection layers 8A, 8B made of material with low heat-resistance in the two semiconductor integrated circuit device 43 and 44.

Also, since the semiconductor integrated circuit device 43 and 44 can be bonded together with high bonding strength, it is possible to suppress the occurrence of holes, voids and the like on the interface between the semiconductor integrated circuit device 43 and 44. Further, since the differences in level on the surfaces of the respective insulating layers 7 can be restored and the surfaces of the respective insulating layers 7 can be made flat, the semiconductor integrated circuit device 43 and 44 can be bonded together with flatness.

The material for use with the adhesive layer 9 is not limited to the materials of the aforementioned kinds and it can be changed freely so long as such materials can be cured at a temperature lower than the deterioration starting temperature of the interconnection layer 8 made of the material (for example, Al or Cu) with low heat-resistance.

According to the present invention, there is provided a method of manufacturing a solid-state image pickup device which is comprised of a process for forming a plurality of photoelectric conversion elements within a semiconductor substrate, a process for forming an interconnection portion, having an interconnection layer in an insulating layer, on the surface side of the semiconductor substrate, a process for forming an adhesive layer, made of a material cured at a temperature lower than a deterioration starting temperature of the interconnection layer, on the surface side of the interconnection portion and bonding a supporting substrate to the interconnection portion through the adhesive layer by heat treatment at a temperature lower than the deterioration starting temperature of the interconnection layer and a process for decreasing a thickness of the semiconductor substrate from the back side.

According to a method of manufacturing a solid-state image pickup device of the present invention, since this solid-state image pickup device manufacturing method includes the process for forming a plurality of photoelectric conversion elements within the semiconductor substrate, the process for forming the interconnection portion, having the interconnection layer in the insulating layer, on the surface side of the semiconductor substrate and the process for forming the adhesive layer, made of the material cured at the temperature lower than the deterioration starting temperature of the interconnection layer, on the surface side of the interconnection portion and bonding the supporting substrate to the interconnection portion through the adhesive layer by heat treatment at the temperature lower than the deterioration starting temperature of the interconnection layer and the process for decreasing the thickness of the semiconductor substrate from the back side, in the process for bonding the supporting substrate to the interconnection portion through the adhesive layer, the adhesive layer can be cured by the heat treatment at the temperature lower than the deterioration starting temperature of the interconnection layer that was formed previously. Thus, the supporting substrate can be bonded to the interconnection portion through the adhesive layer without exerting a thermal influence upon the interconnection layer that was previously formed on the surface side of the semiconductor substrate.

According to the present invention, there is provided a solid-state image pickup device which is comprised of a semiconductor substrate, a plurality of photoelectric conversion elements formed within the semiconductor substrate, an interconnection portion, having an interconnection layer in an insulating layer, formed on the surface side of the semiconductor substrate and a supporting substrate bonded to the surface side of the interconnection portion through an adhesive layer, wherein the adhesive layer is made of a material cured at a temperature lower than a deterioration starting temperature of the interconnection layer.

According to a solid-state image pickup device of the present invention, since this solid-state image pickup device is comprised of a semiconductor substrate, a plurality of photoelectric conversion elements formed within the semiconductor substrate, the interconnection portion, having the interconnection layer in the insulating layer, formed on the surface side of the semiconductor substrate and the supporting substrate bonded to the surface side of the interconnection portion through the adhesive layer, wherein the adhesive layer is made of the material cured at the temperature lower than the deterioration starting temperature of the interconnection layer, upon manufacturing, the adhesive layer can be cured by the heat treatment at the temperature lower than the deterioration starting temperature of the interconnection layer that was formed previously. Thus, in the process for bonding the supporting substrate to the interconnection portion through the adhesive layer, it is possible to protect the interconnection layer formed on the surface side of the semiconductor substrate from being affected thermally.

Further, according to the present invention, there is provided a method of manufacturing a semiconductor integrated circuit device which is comprised of a process for forming a circuit element on a semiconductor substrate, a process for forming an interconnection portion, having an interconnection layer in an insulating layer, on the surface side of the semiconductor substrate and a process for forming an adhesive layer, made of a material cured at a temperature lower than a deterioration starting temperature of the interconnection layer, on the surface side of the interconnection portion and bonding a supporting substrate to the interconnection portion through the adhesive layer by heat treatment at a temperature lower than the deterioration starting temperature of the interconnection layer.

Further, according to a method of manufacturing a semiconductor integrated circuit device of the present invention, since this semiconductor integrated circuit device manufacturing method is comprised of the process for forming the circuit element on the semiconductor substrate, the process for forming the interconnection portion, having the interconnection layer in the insulating layer, on the surface side of the semiconductor substrate and the process for forming an adhesive layer, made of the material cured at the temperature lower than the deterioration starting temperature of the interconnection layer, on the surface side of the interconnection portion and bonding the supporting substrate to the interconnection portion through the adhesive layer by the heat treatment at the temperature lower than the deterioration starting temperature of the interconnection layer, in the process for bonding the supporting substrate to the interconnection portion through the adhesive layer, the adhesive layer can be cured by the heat treatment at the temperature lower than the deterioration starting temperature of the interconnection layer that was formed previously. Thus, it is possible to bond the supporting substrate to the interconnection portion through the adhesive layer without exerting a thermal influence upon the interconnection layer that was previously formed on the surface side of the semiconductor substrate.

Furthermore, according to the present invention, there is provided a semiconductor integrated circuit device which is comprised of a circuit element formed within a semiconductor substrate, an interconnection portion, having an interconnection layer in an insulating layer, formed on the surface side of the semiconductor substrate and a supporting substrate bonded to the surface side of the interconnection portion through an adhesive layer, wherein the adhesive layer is made of a material cured at a temperature lower than a deterioration starting temperature of the interconnection layer.

Furthermore, according to the semiconductor integrated circuit device of the present invention, since this semiconductor integrated circuit device is comprised of the circuit element formed within the semiconductor substrate, the interconnection portion, having the interconnection layer in the insulating layer, formed on the surface side of the semiconductor substrate and the supporting substrate bonded to the surface side of the interconnection portion through the adhesive layer, wherein the adhesive layer is made of the material cured at the temperature lower than the deterioration starting temperature of the interconnection layer, upon manufacturing, the adhesive layer can be cured by the heat treatment at the temperature lower than the deterioration starting temperature of the interconnection layer that was formed previously. Thus, in the process for bonding the supporting substrate to the interconnection portion through the adhesive layer, it is possible to protect the interconnection layer formed on the surface side of the semiconductor substrate from being affected thermally.

Furthermore, according to the solid-state image pickup device manufacturing method and the semiconductor integrated circuit device manufacturing method of the present invention, the supporting substrate can be bonded to the interconnection portion without exerting a thermal influence upon the interconnection layer that was formed previously. Therefore, it is possible to manufacture the solid-state image pickup device and the semiconductor integrated circuit device with excellent characteristics.

Furthermore, according to the semiconductor solid-state image pickup device and the semiconductor integrated circuit device of the present invention, when the supporting substrate is bonded to the interconnection portion through the adhesive layer, it is possible to avoid a thermal influence from being exerted upon the previously-formed interconnection layer. Therefore, it is possible to realize the highly-reliable solid-state image pickup device and semiconductor integrated circuit device with high performance.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A method of manufacturing a solid-state image pickup device comprising:
    a process for forming a plurality of photoelectric conversion elements within a semiconductor substrate;
    a process for forming an interconnection portion, having an interconnection layer in an insulating layer, on the surface side of said semiconductor substrate;
    a process for forming an adhesive layer, made of a material cured at a temperature lower than a deterioration starting temperature of said interconnection layer, on the surface side of said interconnection portion and bonding a supporting substrate to said interconnection portion through said adhesive layer by heat treatment at a temperature lower than the deterioration starting temperature of said interconnection layer; and
    a process for decreasing a thickness of said semiconductor substrate from the back side.

2. A method of manufacturing a solid-state image pickup device according to claim 1, wherein said adhesive layer is formed of a coated film.

3. A method of manufacturing a solid-state image pickup device according to claim 1, wherein said adhesive layer is formed by a CVD (chemical vapor deposition) method.

4. A method of manufacturing a solid-state image pickup device according to claim 1, wherein said adhesive layer is silicified as a silicide layer by the heat treatment in the process for bonding said supporting substrate to said interconnection portion through said insulating layer after a metal film was deposited by a sputtering method.

5. A method of manufacturing a semiconductor integrated circuit device comprising:
    a process for forming a circuit element on a semiconductor substrate;
    a process for forming an interconnection portion, having an interconnection layer in an insulating layer, on the surface side of said semiconductor substrate; and
    a process for forming an adhesive layer, made of a material cured at a temperature lower than a deterioration starting temperature of said interconnection layer, on the surface side of said interconnection portion and bonding a supporting substrate to said interconnection portion through said adhesive layer by heat treatment at a temperature lower than the deterioration starting temperature of said interconnection layer.

6. A method of manufacturing a semiconductor integrated circuit device according to claim 5, wherein said adhesive layer is formed of a coated film.

7. A method of manufacturing a semiconductor integrated circuit device according to claim 5, wherein said adhesive layer is formed by a CVD (chemical vapor deposition) method.

8. A method of manufacturing a semiconductor integrated circuit device according to claim 5, wherein said adhesive layer is silicified as a silicide layer by the heat treatment in the process for bonding said supporting substrate to said interconnection portion through said insulating layer after a metal film was deposited by a sputtering method.

9. A method of manufacturing a semiconductor integrated circuit device according to claim 5, further comprising a process for decreasing a thickness of said semiconductor from the back side after said process for bonding said supporting substrate to said interconnection portion through said insulating layer.

10. A method of manufacturing a semiconductor integrated circuit device according to claim 5, wherein said substrate is composed of a circuit element formed on a semiconductor substrate and an interconnection portion, having an interconnection layer in an insulating layer, formed on the surface side of said semiconductor substrate.

* * * * *